United States Patent

Lee et al.

[11] Patent Number: 5,777,924
[45] Date of Patent: Jul. 7, 1998

[54] FLASH MEMORY ARRAY AND DECODING ARCHITECTURE

[75] Inventors: Peter Wung Lee, Saratoga, Calif.; Fu-Chang Hsu; Hsing-Ya Tsao, both of Taipei, Taiwan

[73] Assignee: Aplus Integrated Circuits, Inc., Saratoga, Calif.

[21] Appl. No.: 872,475

[22] Filed: Jun. 5, 1997

[51] Int. Cl.[6] .................. G11C 11/34; G11C 7/00
[52] U.S. Cl. .............. 365/185.11; 365/85.22; 365/185.29; 365/185.33; 365/218
[58] Field of Search .............. 365/185.11, 185.22, 365/185.29, 185.33, 218

[56] References Cited

U.S. PATENT DOCUMENTS 5,200,922  4/1993  Rao .................. 365/185.11
5,546,402  8/1996  Niijima et al. .......... 365/185.11
5,671,177  9/1997  Ueki .................. 365/185.11

*Primary Examiner*—David C. Nelms
*Assistant Examiner*—Trong Phan

[57] ABSTRACT

A flash memory circuit having a word line decoder with even and odd word line latches and a source line decoder with a source line latch is disclosed. The word line decoders and source line decoder provide the capability of erasing the memory cells of two adjacent word lines in a flash memory simultaneously and verifying the memory cells word line by word line. By erasing two adjacent rows simultaneously, the embodiments of this invention eliminates over-erasure and source disturbance problems associated with conventional flash memory circuits. The decoding architecture provides flexible erase size that can be from a pair to a large number of multiple pairs of word lines. By dividing the memory cells of a word line into a number of segments, the decoding circuit further provides the capability of selecting the memory cells of a word line segment for erasing.

41 Claims, 16 Drawing Sheets

| | XD1,2 SEL | XD1,2 NON-SEL | XS | XT SEL | XT NON-SEL | XTB SEL | XTB NON-SEL | WL SEL | WL NON-SEL | SLX SEL | SLX NON-SEL | SLY SEL | SLY NON-SEL | ST SEL | ST NON-SEL | STB SEL | STB NON-SEL | SL SEL | SL NON-SEL |
|---|---|---|---|---|---|---|---|---|---|---|---|---|---|---|---|---|---|---|---|
| ERASE | -8V | 0V | 0V | 0V | -8V | +6V | 0V | -8V | 0V/-Vx | +5V | 0V | FLOAT-ING | | +6V | 0V | 0V | +6V | +5V | 0V |
| ERASE-VERIFY | +1.5V | -Vx | 0V | Vdd | -Vx | +6V | 0V | +1.5V | 0V/-Vx | +5V | 0V | 0V | | +6V | 0V | 0V | +6V | 0V | 0V |
| OVER-ERASE-VERIFY | +0.5V | -Vx | 0V | Vdd | -Vx | Vdd | 0V | +0.5V | 0V/-Vx | 0V | 0V | 0V | | Vdd | 0V | Vdd | 0V | 0V | 0V |
| REPAIR | +5V | -Vx | 0V | +5V | -Vx | Vdd | 0V | +5V | 0V/-Vx | 0V | 0V | 0V | | Vdd | 0V | Vdd | 0V | 0V | 0V |
| PROGRAM | +8V | 0V | 0V | +8V | 0V | Vdd | 0V | +8V | 0V | 0V | 0V | 0V | | Vdd | 0V | Vdd | 0V | 0V | 0V |
| PROGRAM-VERIFY | +4.5V | 0V | 0V | Vdd | 0V | Vdd | 0V | +4.5V | 0V | 0V | 0V | 0V | | Vdd | 0V | Vdd | 0V | 0V | 0V |
| READ | Vdd | 0V | 0V | Vdd | 0V | Vdd | 0V | Vdd | 0V | 0V | 0V | 0V | | Vdd | 0V | Vdd | 0V | 0V | 0V |

FIGURE 3b

| | XD | | XS | | XT | | XTB | | WL | | SLX | | ST | | STB | | SL | |
|---|---|---|---|---|---|---|---|---|---|---|---|---|---|---|---|---|---|---|
| | SEL | NON-SEL | SEL | NON-SEL | SEL | NON-SEL | SEL | NON-SEL | SEL | NON-SEL | SEL | NON-SEL | SEL | NON-SEL | SEL | NON-SEL | SEL | NON-SEL |
| MULTI-BLOCK ERASE | 0V | -8V | -8V | 0V | 0V | 0V | 0V | 0V | -8V | 0V | +5V | 0V | +6V | 0V | 0V | +6V | +5V | 0V |
| SMALL-SECTOR ERASE | -8V | -8V | -8V | 0V | -8V | 0V | 0V | +1V -8V | -8V | 0V | +5V | 0V | +6V | 0V | 0V | +6V | +5V | 0V |
| ERASE-VERIFY | -VT 0V | -VT | 0V | +1.5V | -VT-VT | -VT | +1.5V | -VT/0V | +5V | 0V | +6V | 0V | 0V | +6V | 0V | 0V |
| OVER-ERASE-VERIFY | -VT 0V | -VT | 0V | +0.5V | -VT-VT | -VT | +0.5V | -VT/0V | 0V | 0V | Vdd | 0V | 0V | Vdd | 0V | 0V |
| REPAIR | -VT 0V | -VT | 0V | +5V | -VT-VT | -VT | +5V | -VT/0V | 0V | 0V | Vdd | 0V | 0V | Vdd | 0V | 0V |
| PROGRAM | 0V | +8V | 0V | 0V | +8V | 0V | 0V | +8V | +8V | 0V | 0V | 0V | Vdd | 0V | 0V | Vdd | 0V | 0V |
| PROGRAM-VERIFY | 0V | +4.5V | 0V | 0V | +4.5V | 0V | 0V | +4.5V | +4.5V | 0V | 0V | 0V | Vdd | 0V | 0V | Vdd | 0V | 0V |
| READ | 0V | Vdd | 0V | 0V | Vdd | 0V | 0V | Vdd | Vdd | 0V | 0V | 0V | Vdd | 0V | 0V | Vdd | 0V | 0V |

FIGURE 5b

FLASH MEMORY ARRAY AND DECODING ARCHITECTURE

FIELD OF INVENTION

The present invention relates to the design and circuit structure of a flash memory, and more specifically to the architecture of word line and source line decoders of a flash memory.

BACKGROUND OF THE INVENTION

In recent years, flash memory devices have been widely used in computer related equipment and other electronic appliances as storage devices. The nonvolatile and on-chip programmable capabilities of a flash memory are very important for storing data in many applications. As an example, flash memories are frequently used for the BIOS storage of a personal computer. In addition, the small physical size of flash memories also makes them very suitable for portable applications. Therefore, they have been used for storing programs and data for many portable electronic devices such as cellular phones, digital cameras and video game platforms.

Different from a normal random access memory (RAM) that can be randomly read, erased and programmed on a byte basis, a conventional EPROM-type flash memory features a byte-program and a block-erase capability with each block containing a number of bytes. Because the data within a memory block can not be selected for erasure individually, a flash memory has to erase the data of a whole block of memory cells, i.e., an erase block, and then program the new data byte by byte. The block erase scheme, however, not only is inflexible but also has an undesirable problem called over-erasure. The over-erasure results from the inherent difference between the speed of erasing of each memory cell. Because a large number of cells are erased together, the cells having fast speed of erasing may be over-erased below 0V, while the cells having slow speed are not successfully erased yet. The over-erased cells will conduct leakage current and cause the malfunction of bit line (BL) sense amplifiers.

To add more flexibility for erasing memory cells, isolate non-selected memory cells and avoid disturbance of data, U.S. Pat. No. 5,548,551 provides a negative voltage decoder for erasing either one memory cell or a block of memory cells for a non-volatile memory. In practical applications, however, it is desired that a small (multiple bytes) and flexible (random and multiple word lines) erase size for the erase operation of a flash memory can be accomplished without any memory disturbance and over-erasure problems.

SUMMARY OF THE INVENTION

This invention has been made to overcome the above mentioned drawbacks of a conventional flash memory. The primary object of this invention is to provide a circuit structure that offers the capability of erasing memory cells on a small and flexible number of word lines of a flash memory. Another object of this invention is to provide a method of erasing a multiple number of word line pairs simultaneously as well as verifying each individual word line one at time. Yet another object of this invention is to provide a memory circuit structure and methods of operating the memory circuit to eliminate the memory disturbance and over-erasure problems that often occur in a conventional flash memory circuit. A further object of this invention is to provide a source line circuit having segmented source lines so that the flash memory cells of a small segment in a word line can be erased without source disturbance.

The memory cells of the flash memory circuit of this invention are divided into a number of banks. The memory cells in each memory bank are organized as a plurality of rows and a plurality of columns. The sources of the memory cells of two adjacent rows are wired together and connected to a common source line. Each memory bank of this invention has its own word line decoder and source line decoder. The source line decoder has a source line latch associated with it for providing desired voltage levels under various memory operations. Address lines to the word line decoder and the source line decoder choose the selected word line and source line for memory operations.

In a first preferred embodiment, each word line decoder has both odd and even word line latches associated with it. For the erase operation, the preferred mode of operation of this invention is to select two adjacent word lines which share the common source line from each memory bank for erasing. When the memory cells of the two adjacent word lines are erased, negative voltages can be applied through the word line latches to both word lines and a positive voltage such as 5V can be applied through the source line latch to provide an appropriate bias condition for the erase operation. When the memory cells are erase-verified, the word line under verification can be applied a verifying voltage through one word line latch while the other word line latch can provide a low voltage sufficient enough to cut off the over-erased memory cells on the other word line that is not under verification. Therefore, the false reading that usually exists in verifying a single word line is eliminated. In addition, each word line can be stopped erasing after being verified by applying appropriate voltage through its associated word line latch to reduce the over-erase problem. According to the embodiment, a multiple number of memory banks each having two word lines that share the same source line for erasing can be erased simultaneously with one erase operation. The erase size can be from a word line pair to a large number of multiple word line pairs.

In a second embodiment of this invention, there are also two latches associated with the decoder. One of the latches controls if the word line voltage of a selected memory row is provided by either the other latch or by the address lines. By supplying appropriate voltages to the address lines and the latches, a multiple pairs of word lines in a memory bank can be erased simultaneously and verified one by one properly. Nevertheless, if all the word lines in a memory bank are selected for erasing, any other memory bank can only have all its word lines erased or not at the same time because the address lines that may also provide word line voltages for this embodiment are shared by all memory banks. Therefore, for the erase operation, the preferred mode is to erase a multiple pairs of word lines less than the size of a memory bank in one erase operation or to erase a multiple memory banks simultaneously.

Two additional embodiments provide similar functions to the second embodiment are also disclosed. The third embodiment uses an additional latch for controlling how the word line voltage is supplied. With the additional latch, the device of a control circuit of the word line decoder can be better protected under certain conditions. The fourth embodiment which also uses an additional latch reduces the address lines required for both the word line decoder and the source line decoder to a half. The flexibility and preferred mode of operation for the two embodiments are the same as that of the second embodiment.

This invention also presents a source line circuit that allows the selection of the memory cells of a small segment in a row for erasing. By dividing the memory array of a memory bank into a number of segments each comprising a number of columns, the sources of the memory cells of two adjacent rows in a segment can be wired together to form a segmented source line. Each segmented source line on the same word line is connected to a shared source line through a source segment control transistor having a gate coupled to a source segment control line. Therefore, the memory cells on a word line can be erased segment by segment.

BRIEF DESCRIPTION OF THE DRAWINGS

FIG. 3b and FIG. 3b(CONT.) summarize the control signals for the first embodiment of this invention under different memory operations.

FIG. 5b and FIG. 5b(CONT.) summarize the control signals for the second embodiment of this invention under different memory operations.

FIG. 11 shows an exemplary layout for the memory array circuit of FIG. 10a.

DETAILED DESCRIPTION OF THE INVENTION

Figure 1:
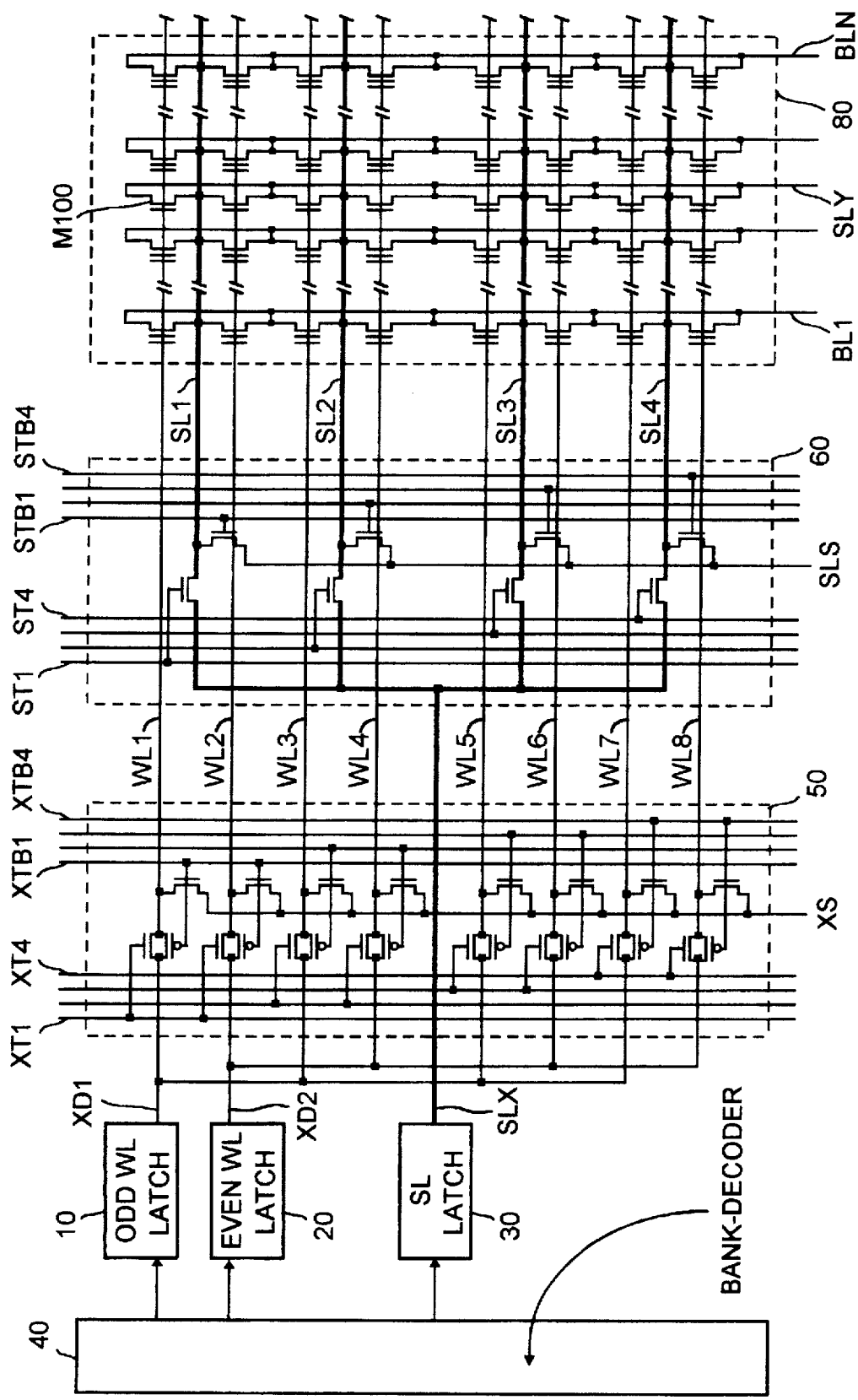
FIG. 1 shows a first embodiment of the circuit of a memory bank of the present invention including a bank decoder, a word line decoder with even and odd word line latch, and a source line decoder with a source line latch.

The present invention divides a flash memory into a plurality of memory banks. With reference to the first embodiment of this invention as shown in FIG. 1, the flash memory circuit comprises a word line (WL) decoder 50, a source line (SL) decoder 60 and a memory bank 80 having an array of memory cells. Each memory bank has an odd WL latch 10, an even WL latch 20 and an SL latch 30 associated with it. A bank decoder 40 for selecting different memory banks of the flash memory is also shown. The WL latches and the SL latch are controlled by the bank decoder. XT1~XT4 and XTB1~XTB4 are address lines that work with the WL decoder 50 to pass or block the voltages from the WL latches to the word lines. ST1~ST4 and STB1~STB4 are address lines that control the SL decoder 60 to pass or block the voltage from the SL latch to the source lines. An XS word control line is connected to a ground voltage in this embodiment.

By means of either the WL latch 10 or 20 and the SL latch 30, the decoder circuit as shown in FIG. 1 allows the erasure of the memory cells on a single word line by applying a negative voltage to the word line and a positive 5V voltage to the source line. (In general, a single word line may comprise 128 or 256 bytes.) However, in the flash memory design of this invention, two adjacent word lines share a same source line as shown in FIG. 1. For example, WL1 and WL2 share one source line SL1. If only WL1 is selected for erasing, erase disturbance may occur on the adjacent non-selected word line WL2. A method of overcoming the drawback of erasing a single selected WL is to read and store the programmed data of the memory cells on its adjacent WL before the erasing. During the erase-verification, the adjacent WL is turned off. After the selected WL has been successfully verified, the data of the memory cells of its source-disturbed adjacent WL after erasing are read and the previously stored data before erasing are retrieved. The read data and stored data are compared. If the data do not match, a program operation is performed to re-program the stored data to the disturbed memory cells. With this method, the circuit shown in the first embodiment of this invention has the flexibility of erasing any number of selected WLs as long as their adjacent WLs that may be disturbed are remembered first and restored later.

A preferred operation of the flash memory circuit of the first embodiment, however, is to simultaneously erase two adjacent WLs having a shared source line so that verification can be accomplished without disturbance. The odd and even WL latches 10, 20 of this invention provide the capability of erasing the memory cells on the two adjacent WLs altogether. If both odd and even WL latches in a selected memory bank apply negative voltages to a selected pair of WLs, and the SL latch in the selected memory bank applies a positive voltage to a selected SL, a pair of word lines can be erased simultaneously and then verified one by one as long as appropriate address signals are sent to the address lines.

All other WLs in the selected memory bank can be grounded through the word control line XS if they are not selected for erasing by the address lines. Similarly, non-selected SLs can also be grounded. Therefore, no memory cells other than the selected memory cells are affected by the biased voltages being applied for the erase operation. The memory disturbance problem is eliminated. In addition, each memory bank has its own odd and even WL latches as well as an SL latch, the erase operation can be applied independently without affecting other memory banks. Consequently, the erase size of the flash memory is very flexible and can be as small as a pair of WLs or a plurality of pairs of WLs. In addition, the memory banks selected for erasing can be almost randomly located anywhere within the flash memory.

To explain the operation of the WL decoder 50 in more detail, the decoder circuit is shown in FIG. 2 again. It can be seen that a p-n transistor pair and another n transistor control if each word line will be connected to a WL latch or grounded to the word control line XS. It is important to note that the preferred erase operation of this embodiment selects a plurality of memory banks with only a pair of WLs from each memory bank to erase if a multiple pairs of WLs are to be erased all at once. By doing so, the disturbance problem can be avoided. From the user's point of view, the logical addresses of the erased memory WLs may still be continuous. However, the bank decoder of this embodiment ensures that only one pair of WLs are selected from each physical memory bank. Although the circuit as shown in FIG. 1 can erase more than one pair of WLs in one memory bank at once, the advantage of this invention can not be fully realized unless only a pair of WLs from each memory bank are erased simultaneously.

Figure 2:
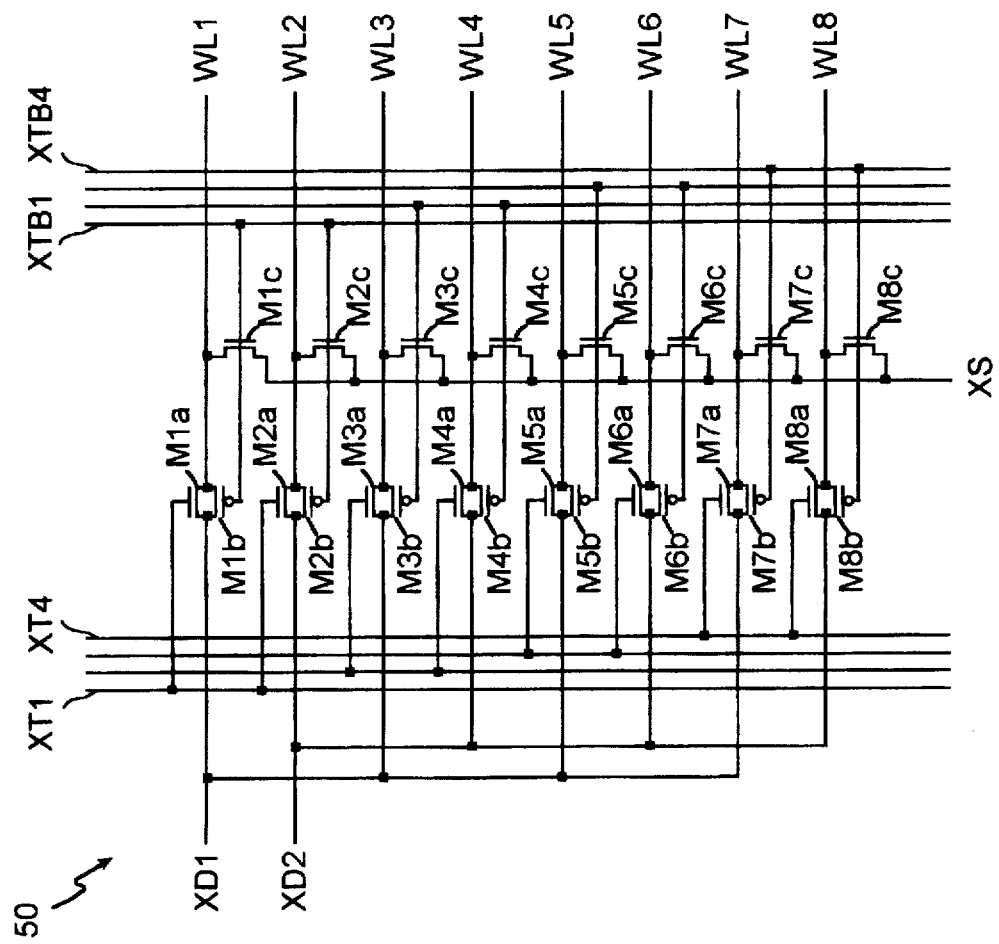
FIG. 2 shows the word line decoder circuit of the first embodiment shown in FIG. 1.

An example of erasing two pairs of WLs is used to explain the operational conditions of the decoder circuit shown in FIG. 2. It is assumed that both WL1 and WL2 of first and second memory banks are selected for erasing. The address lines are applied appropriate voltages to select WL1 and WL2, i.e., 0V for XT1, −8V for XT2~XT4, −8V for XTB1 and 0V for XTB2~XTB4. The XS line in this embodiment is always grounded. In the two selected memory banks, both odd and even WL latches apply −8V to XD1 and XD2 respectively. In the word line decoder 50, there are a plurality of word gating devices each having three transistors for controlling the connection of word lines. For example, WL1 is controlled by transistors M1a, M1b and M1c. Each word line can be connected to either a WL latch or the word control line XS. Under these bias conditions, M1a and M2a as well as M1b and M2b are turned on, and M1c and M2c are turned off to pass XD1 and XD2 to WL1 and WL2. M3a~M8a as well as M3b~M8b are turned off and M3c~M8c are turned on to pass the XS signal to WL3~WL8. Therefore, WL1 as well as WL2 are applied −8V for erasing and WL3~WL8 are grounded and not selected in both memory banks.

The source line decoder 60 comprises a plurality of source gating devices each having two transistors for controlling the connection of a source line to either the SL latch 30 or a source control line SLS. The address lines ST1~ST4 and STB1~STB4 controls the source gating devices for connecting one of the source lines to the SL latch 30. In general, ST1~ST4 have the same logic as XT1~XT4 but may have different voltages and STB1~STB4 have the same logic as XTB1~XTB4 but may have different voltages.

For other memory banks not selected for erasing, both odd and even WL latches apply ground voltages to XD1 and XD2 respectively. Because the conditions of the address lines XT1~XT4 and XTB1~XTB4 have been determined by the WLs selected for erasing, WL1 and WL2 are connected to the ground voltage of XD1 and XD2 respectively, and WL3~WL8 are also passed with the ground voltage of XS. Therefore, none of the WLs is affected by the erase operation.

After a predetermined erasing time the threshold voltage of each cell on each erased WL is verified sequentially to check if the erase operation is finished. The WL to be verified is applied a positive low voltage such as 1.5V. The other erased WLs are applied a negative low voltage such as −3V to cut off all the memory cells on them even if any of the cells has been over-erased and having a threshold voltage between 0V and −3V. The cut-off negative voltage is dependent on the threshold voltages of the over-erased cells. It is detected before the erase-verification by lowering down the erased WL voltage until no memory cell current is sensed.

The detail of determining the threshold voltage is disclosed in U.S. patent application Ser. No. 08/823,571 filed Mar. 25, 1997 assigned to the same assignee of this invention.

The non-selected WLs are applied a small or ground voltage, such as 0V. Assuming that WL1 of the first memory bank is verified, the address lines are applied appropriate voltages to select WL1, i.e., a power supplying voltage Vdd for XT1, −3V for XT2~XT4, −3V for XTB1 and Vdd for XTB2~XTB4. In the first memory bank where the verified WL1 is located, the odd WL latch applies the verifying voltage, i.e. 1.5V, to XD1 and the even WL latch applies the cut-off negative voltage such as −3V to XD2. Under these bias conditions, M1a and M2a as well as M1b and M2b are turned on, and M1c and M2c are turned off to pass XD1 and XD2 to WL1 and WL2 respectively. M3a~M8a as well as M3b~M8b are turned off and M3c~M8c are turned on to pass the XS signal to WL3~WL8. Therefore, WL1 is applied the verifying voltage 1.5V, WL2 is applied the cut-off voltage −3V, and WL3~WL8 are grounded in the memory bank.

In the second memory bank that has an erased WL1 which is not under verification, both odd and even WL latches apply a negative cut-off voltage −3V to XD1 and XD2 respectively. Because the address lines are shared, the bias conditions make WL1 and WL2 connected to the cut-off voltage −3V of XD1 and XD2 respectively, and WL3~WL8 passed with the ground voltage of XS. For other memory banks that have no WL selected for erasing at all, both WL latches apply 0V to XD1 and XD2 respectively. Therefore, WL1 and WL2 are grounded to 0V of XD1 and XD2 correspondingly and WL3~WL8 are grounded to 0V of XS.

After the verification, if WL1 of the first memory bank fails the erase-verification, it will be erased again with the same operation conditions that have been described earlier. If it passes the verification, WL1 will be applied a negative cut-off voltage to stop erasing and cut-off the over-erased memory cells at the same time if there are any over-erased cells. Under this situation, the operation conditions of the next erase cycle are similar to those conditions which have been described earlier except that the odd WL latch in the first memory bank will apply a negative cut-off voltage to XD1.

Based on the forgoing discussion, the present invention provides a decoder circuit for erasing multiple and random WL pairs at the same time. It should be noted that the erase operation of each individual WL is stopped independently. Because each erased WL is controlled by either an even WL latch or an odd WL latch, the erase operation of the WL that already passes the erase-verification can be stopped by resetting its corresponding WL latch to an erase-inhibit state. It is not necessary to wait for the WL that has the slowest speed of being erased to complete erasing before other WLs can be stopped erasing. The advantage of being able to stop erasing independently is that the problem associated with over-erasure of conventional flash memories is greatly reduced.

A keen reader may notice that if a pair of WLs sharing a same SL are erased simultaneously, the verified WL may suffer false reading when it is under erase-verification unless the adjacent WL is cut off. Conventionally, the control gate of the WL not for verification is grounded. However, if a memory cell on the adjacent WL has been over-erased, it can not be shut-off by grounding its control gate. Because the over-erased memory cell conducts current and shares the same source line with the WL being verified, the erase-verification may give an incorrect result. As described in the above example, a negative cut-off voltage determined by the technique disclosed in the referenced U.S. patent application Ser. No. 08/823,571 is applied to the adjacent WL to eliminate the false reading problem.

It is also worth while to mention that the flash memory of this invention requires three control gate voltages for the WLs when erase-verification is performed. In addition to the verifying voltage and the ground voltage as used in a conventional flash memory, a negative cut-off voltage as mentioned in the previous paragraph is necessary. U.S. patent applications Ser. No. 08/645,630 and Ser. No. 08/676,066 that both are assigned to the same assignee of this invention disclose a method for applying at least three voltages from the WL latches. The technique is incorporated in this invention for providing three different control gate voltages to the WLs.

Figure 3A:
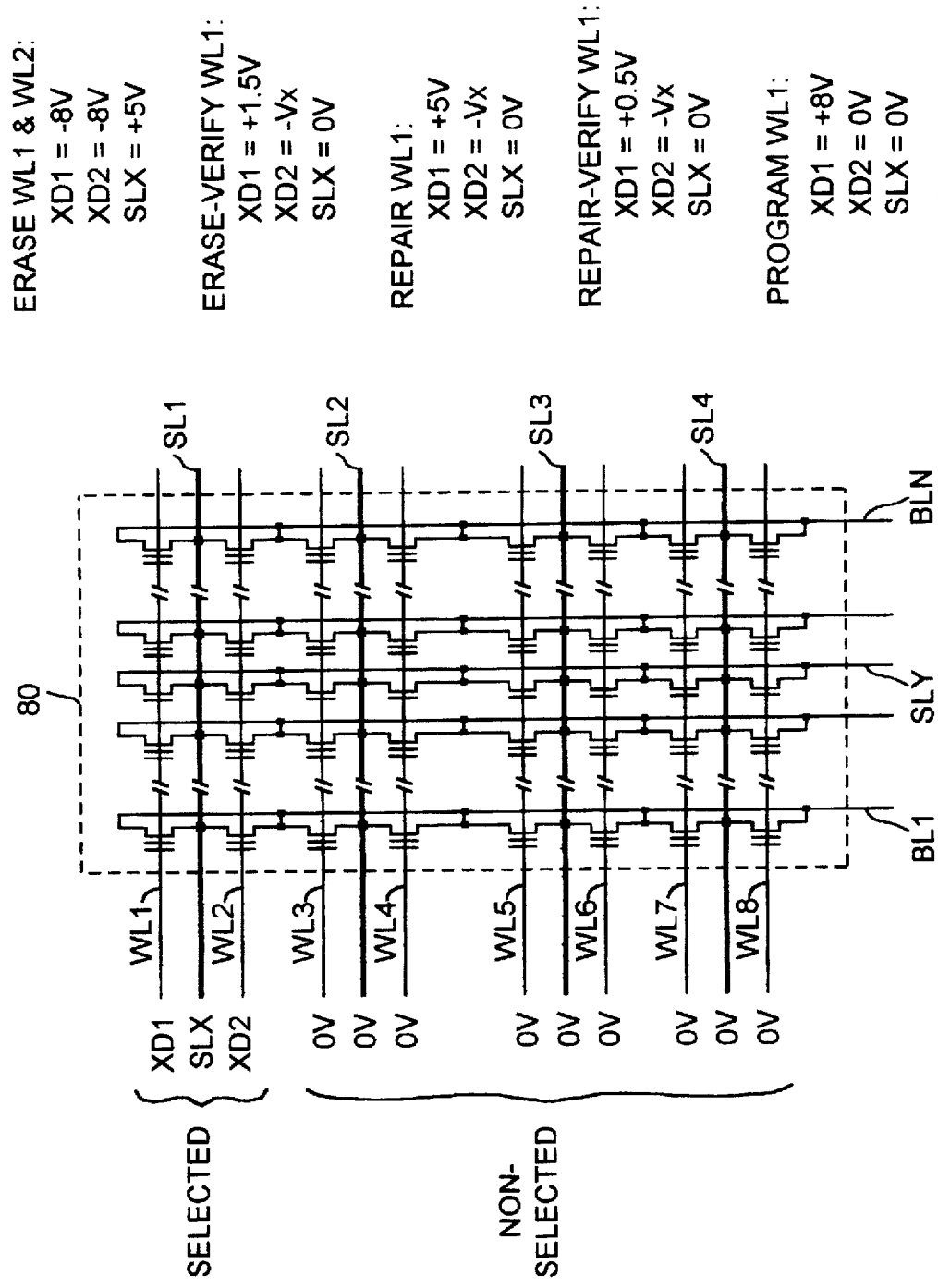
FIG. 3a shows the memory array circuit of a memory bank and the operational conditions of the decoder circuit for various memory operations.

FIG. 3a shows an example of the bias conditions for various memory operations of the word lines in one memory bank. It is assumed that both WL1 and WL2 have been selected for erasing, i.e., XD1, XD2 and SLX have been connected to WL1, WL2 and SL1 respectively by the address lines. The conditions for an erase operation and an erase-verify operation have been described in the earlier discussion in connection with FIG. 2. For erase operation, both XD1 and XD2 are −8V and SLX is 5V. For erase-verification of WL1, XD1 is +1.5V, XD2 is a negative cut-off voltage −Vx that has been assumed −3V in the earlier discussion, and SLX is 0V. For over-erase-verification of WL1, XD1 is a voltage +0.5V, XD2 is a negative cut-off voltage −Vx, and SLX is 0V. For repairing WL1, XD1 is +5V, XD2 is a negative cut-off voltage −Vx, SLX is 0V. For programming WL1, XD1 is +8V, and both XD2 and SLX are 0V.

A summary of required WL voltages of this embodiment under different operations is as follows. Three voltages are required for erase, erase-verify, over-erase-verify, and repair operations. For WLs selected for erasing, an operating voltage is applied. For a WL that is erase-verified or over-erase-verified, an erase-verify voltage or a repair voltage is applied. For a WL that has been erased but not under verification, a negative cut-off voltage is applied to shut off the WL. For WLs that have not been selected for erasing, they are grounded. It should be noted that after the repair operation, all over-erased WLs are recovered. It is not necessary to shut off the over-erased memory cells any more. Therefore, only two voltages are required for program and read operations. An operating voltage is applied to the programmed or read WL and the other WLs are grounded. A summary of the control signals for the first embodiment of this invention under different memory operations is listed in FIG. 3b.

Figure 4:
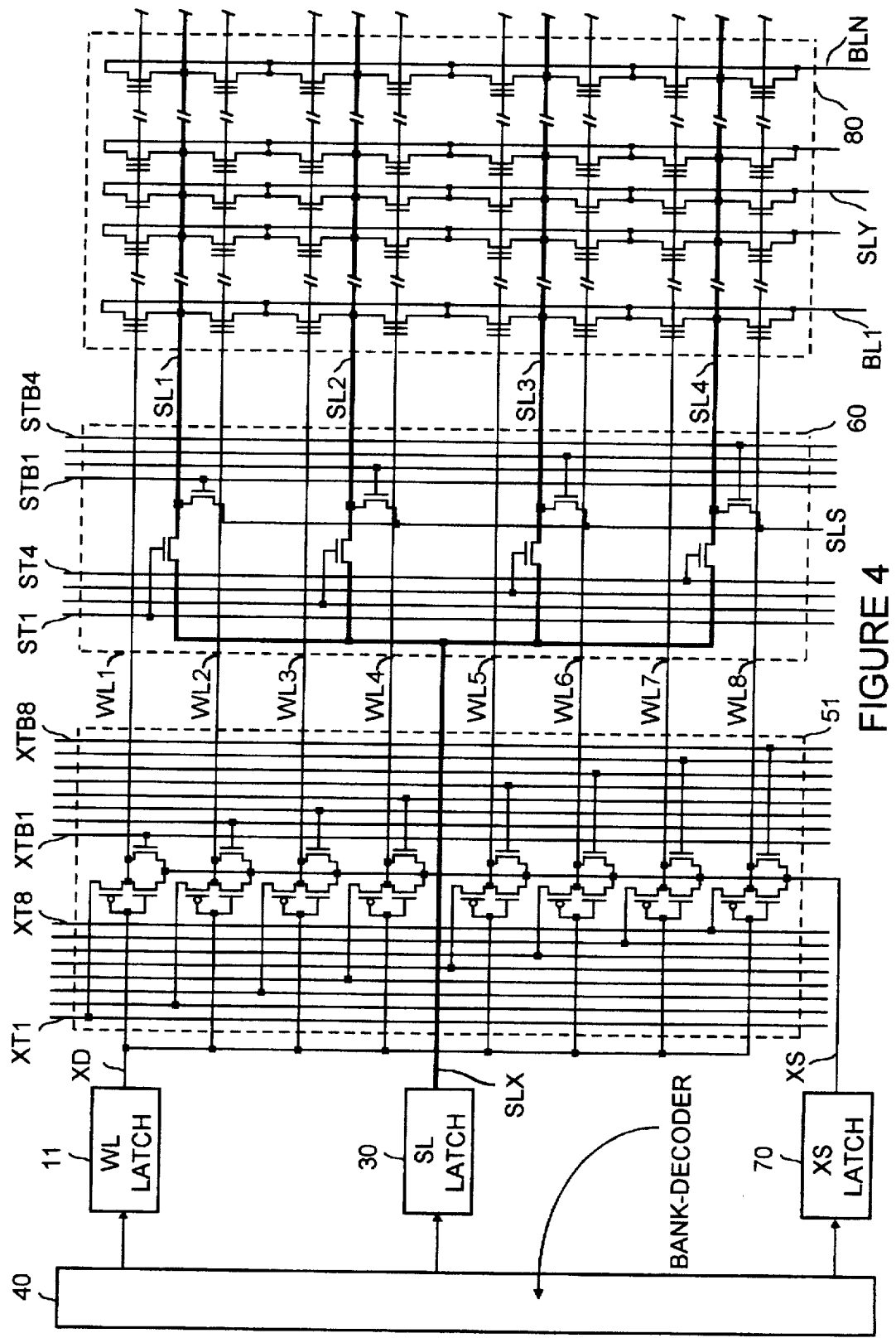
FIG. 4 shows a second embodiment of the circuit of a memory bank of the present invention including a bank decoder, a word line decoder with a word line latch and a source line decoder with a source line latch.

FIG. 4 shows a second embodiment of the present invention. In this embodiment, the flash memory circuit comprises a WL decoder 51, an SL decoder 60 and a memory bank 80 having an array of memory cells. Each memory bank has a WL latch 11, an SL latch 30, and a word control line (XS) latch 70 associated with the bank. A bank decoder 40 selects different memory banks of the flash memory. The SL decoder 60, the SL latch 30, the memory bank 80 and the bank decoder 40 are identical to those described in the first embodiment. The same numerals are also used to identify these circuit blocks. In the word line decoder 51, there are a plurality of word gating devices each having three transistors for controlling the connection of word lines. For example, WL1 is controlled by a gating device having transistors M1a, M1b and M1c. By means of the WL latch 11, the SL latch 30, and the XS latch 70, the WL decoder circuit 51 as shown in FIG. 4 can connect each WL within a memory bank to either its address line XT (one of XT1~XT4) or the XS latch 70.

If the number of WLs selected for erasing is less than the size of a memory bank, the WL latch 11 of the memory bank sends a negative voltage to XD that makes the connection of each WL in the memory bank dependent on its respective address line XT. If the address line is a negative voltage, the corresponding WL is connected to the XS latch 70 which provides a negative voltage for erasing. If the address line is grounded, the corresponding WL is also grounded. Due to less flexibility of the WL decoder 51, if the number of WLs selected for erasing is greater than the size of a memory bank, this embodiment can only erase all the WLs of one or more memory banks altogether and the erase size has to be a multiple of the size of a memory bank. In other words, if all the WLs within one memory bank have been selected for erasing, all the WLs of any other memory bank have to be either selected for erasing or not selected for erasing. Although the erase size is not as flexible as the first embodiment, it is still possible to have very flexible erase size by using two erase operations.

As can be seen from FIG. 4, two adjacent word lines share a same source line. It is difficult to avoid the memory disturbance problem. As discussed in the first embodiment, it is preferred that two adjacent WLs be erased altogether at the same time although any number of WLs less than the size of a memory bank can be selected for erasing. Therefore, the preferred mode of operation of the decoder circuit of this embodiment has an erase size being an even number less than the size of a memory bank, or a multiple of the size of a memory bank.

Figure 5A:
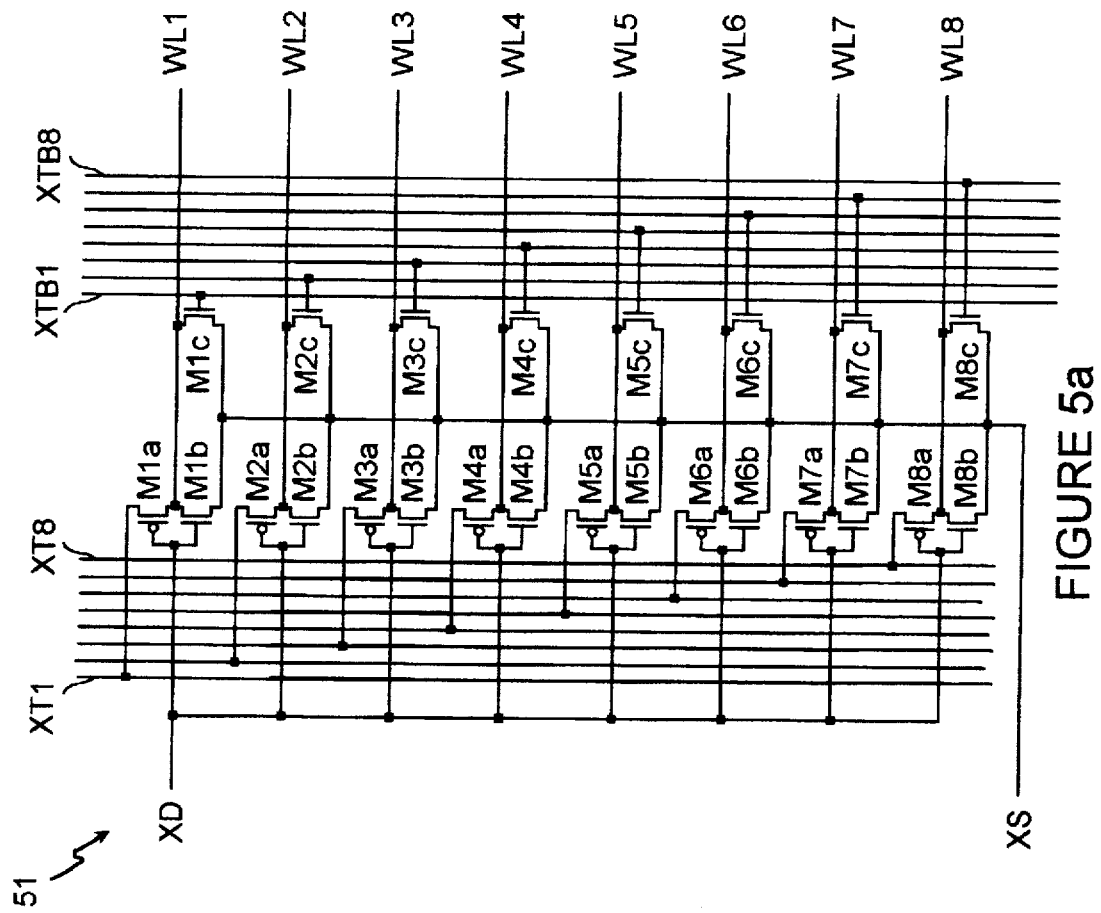
FIG. 5a shows the word line decoder circuit of the second embodiment shown in FIG. 4.

For describing the operation of the second embodiment, the WL decoder circuit 51 of a memory bank is shown again in FIG. 5a. Each memory bank has only one WL latch for generating XD signal. The XD signal is sent to the common gates of a p-n transistor pair as shown in FIG. 5a. Each address line XT is sent to the drain of a p-MOS transistor. The drains of two n-MOS transistors are tied together and connected to the XS latch 70. Therefore, either XT or XS is passed to a WL according to the XD signal. Eight WLs are shown in one memory bank in this example.

To illustrate how the decoder works, the case of selecting only a number of WLs less than the size of a memory bank for erasing is discussed first. The voltages of XT1~XT4 are −8V, XT5~XT8 are 0V, XTB1~XTB4 are +1V, and XTB5~XTB8 are −8V to select WL1~WL4 of the memory bank for erasing. The WL latch and the XS latch of the selected memory bank apply −8V to XD and XS respectively. Under these conditions, M1a~M4a as well as M1b~M4b are turned off and M1c~M4c are turned on to pass a negative voltage −8V from XS to the selected word lines WL1~WL4. In the mean time, M5b~M8b as well as M5c~M8c are turned off and M5a~M8a are turned on to pass a 0V from XT5~XT8 to the non-selected word lines WL5~WL8.

Because XT1~XT8 and XTB1~XTB8 are shared by respective WLs in each memory bank, the bias conditions of XT1~XT8 and XTB1~XTB8 have been determined by the WLs of the memory bank selected for erasing as described in the previous paragraph. The control of the non-selected memory banks has to be accomplished by appropriate XD and XS voltages within the memory bank. For memory banks that are not selected for erasing, XD is applied −8V and XS is applied 0V. Because the voltages of its WL1~WL4 are passed from XS as described in the previous paragraph, they are 0V. The voltages passed from XT5~XT8 to WL5~WL8 are also 0V. Therefore, all the WLs are not selected for erasing.

To stop erasing any word line of the selected WLs, the corresponding XT can be applied a negative cut-off voltage for passing to the WL. For example, if only WL1 has passed the erase-verification, a negative cut-off voltage low enough to turn off the memory cells on WL1 is applied to XT1. The negative cut-off voltage is lower than the determined threshold voltage as discussed earlier in connection with the referenced U.S. patent application Ser. No. 08/823,571. A good example of the negative cut-off voltage may be −3V. XT1B is also applied −8V. M1c is turned off and the negative bias voltage turns on M1a and passes itself to WL1. The remaining word lines WL2~WL4 are not affected and their erase operation continue.

After an erase operation for WL1~WL4, each word line can be verified individually. For verifying the word line WL1, a verifying voltage such as +1.5V is applied to XT1, XT2~XT4 are applied a negative cut-off voltage −3V and XT5~XT8 are applied 0V. XTB1 is applied a negative cut-off voltage −3V, XTB2~XTB4 are applied 0V and XTB5~XTB8 are applied a negative cut-off voltage −3. Both XD and XS are applied a negative cut-off voltage −3 from the WL latch and the XS latch respectively. Under these conditions, M2a~M4a as well as M2b~M4b are turned off and M2c~M4c are turned on to pass the negative cut-off voltage −3 from XS to word lines WL2~WL4 that are erased but not under verification. In the mean time, M5b~M8b as well as M5c~M8c are turned off and M5a~M8a are turned on to pass a 0V from XT5~XT8 to the non-selected word lines WL5~WL8. M1b as well as M1c are turned off and M1a is turned on to pass the verifying voltage +1.5V from XT1 to WL1 for verification.

As mentioned before, the second embodiment also allows the erasing of multiple memory banks all at once. All the WLs of each selected memory bank must be erased or stopped together. For the case of erasing multiple memory banks, XT1~XT8 are applied 0V and XTB1~XTB8 are applied either −8V or 0V. For each memory bank selected for erasing, the corresponding WL latch applies 0V to XD and the corresponding XS latch applies −8 to XS. Under this circumstance, M1a~M8a are turned off and M1b~M8b as well as M1c~M8c are turned on. Therefore, WL1~WL8 are applied a voltage −8 passed from XS for erasing. For each memory bank not selected for erasing, the corresponding WL latch applies −8 to XD and the corresponding XS latch applies 0V to XS. Consequently, M1a~M8a are turned on and M1b~M8b as well as M1c~M8c are turned off. WL1~WL8 are applied 0V passed from XT1~XT8 respectively.

Although the WLs of each selected memory bank must be erased or stopped together, it is possible that one memory bank is stopped erasing while the other memory bank continues its erase operation. When it is necessary to stop a selected memory bank, the XS latch applies a negative cut-off voltage as discussed before, such as −3V, to XS. The negative cut-off voltage at XS is passed to all the WLs in the memory bank to shut off the memory cells because M1a~M8a are turned off and M1b~M8b as well as M1c~M8c are turned on.

Each erased WL has to be verified individually. If WL1 of a memory bank is to be verified, XT1 is applied a verifying voltage +1.5V and XT2~XT8 are applied a negative cut-off voltage −3. XTB1 is applied a negative cut-off voltage −3V and XTB2~XTB8 are applied 0V. For the memory bank having the verified WL1, both XD and XS are applied a negative cut-off voltage −3V from the WL latch and the XS latch respectively. Under these conditions, M2a~M8a as well as M2b~M8b are turned off and M2c~M8c are turned on to pass the negative cut-off voltage −3V from XS to word lines WL2~WL8 that are erased but not under verification. In the mean time, M1b as well as M1c are turned off and M1a is turned on to pass the verifying voltage +1.5V from XT1 to WL1 for verification.

For other memory banks that have been erased but not under verification, the corresponding WL latch applies +1V to XD and the corresponding XS latch also applies a negative cut-off voltage −3V to XS. Under this circumstance, M1a~M8a are turned off and M1b~M8b are turned on. M1c is turned off and M2c~M8c are turned on. It can be understood that all the word lines WL1~WL8 are applied the negative cut-off voltage −3V passed from XS so that the verification of WL1 in the selected memory bank is not disturbed. For each memory bank not selected for erasing, the corresponding WL latch applies +1V to XD and the corresponding XS latch applies 0V to XS. Consequently, M1a~M8a are turned off and M1b~M8b are turned on. M1c is turned on and M2c~M8c are turned off. The circuit condition also allows WL1~WL8 to be applied 0V passed from XS. FIG. 5b summarizes the control signals for the second embodiment of this invention under different memory operations.

Figure 6:
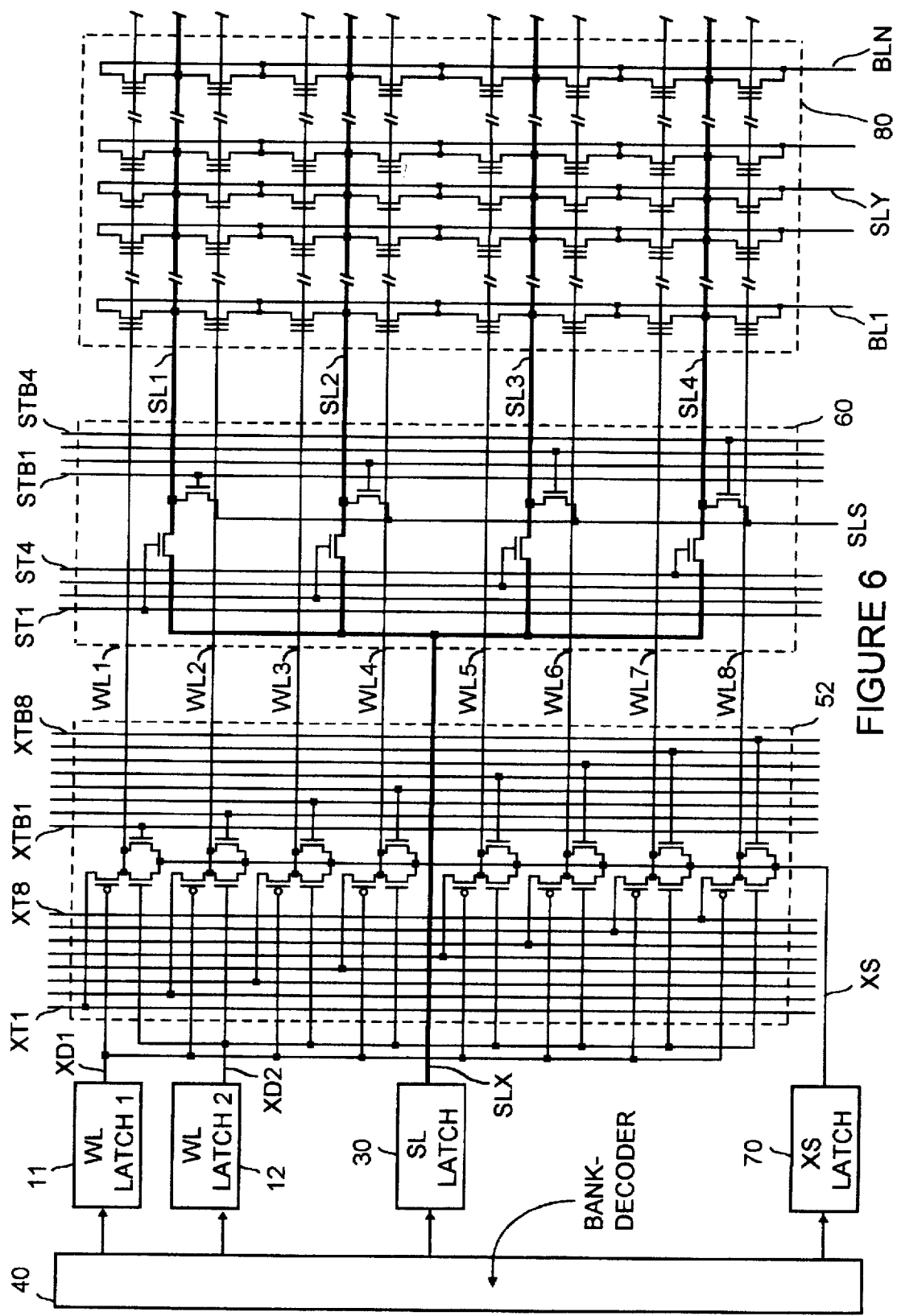
FIG. 6 shows a third embodiment for the circuit of a memory bank of this invention.

FIG. 6 shows a third embodiment of this invention. In this embodiment, the flash memory circuit comprises a WL decoder 52, an SL decoder 60 and a memory bank 80 having an array of memory cells. Each memory bank has a first WL latch 11, a second WL latch 12, an SL latch 30, and an XS latch 70 associated with the bank. A bank decoder 40 selects different memory banks of the flash memory. This embodiment is almost identical to the second embodiment described earlier except that two WL latches are used to send XD1 and XD2 signals to the gates of the p-MOS transistor and n-MOS transistor in the WL decoder 52 respectively. This embodiment offers some protection on the p-n transistors in certain cases because the two gates of each p-n transistor pair are not connected together and the two WL latches can provide different voltages. As an example, XD2 can be applied +1V for turning on the n-MOS transistor in order to pass XS signal to a WL and the p-MOS transistor can be shut off by applying 0V to XD1 to avoid being broken down due to a large voltage difference between its source and gate.

Figure 7:
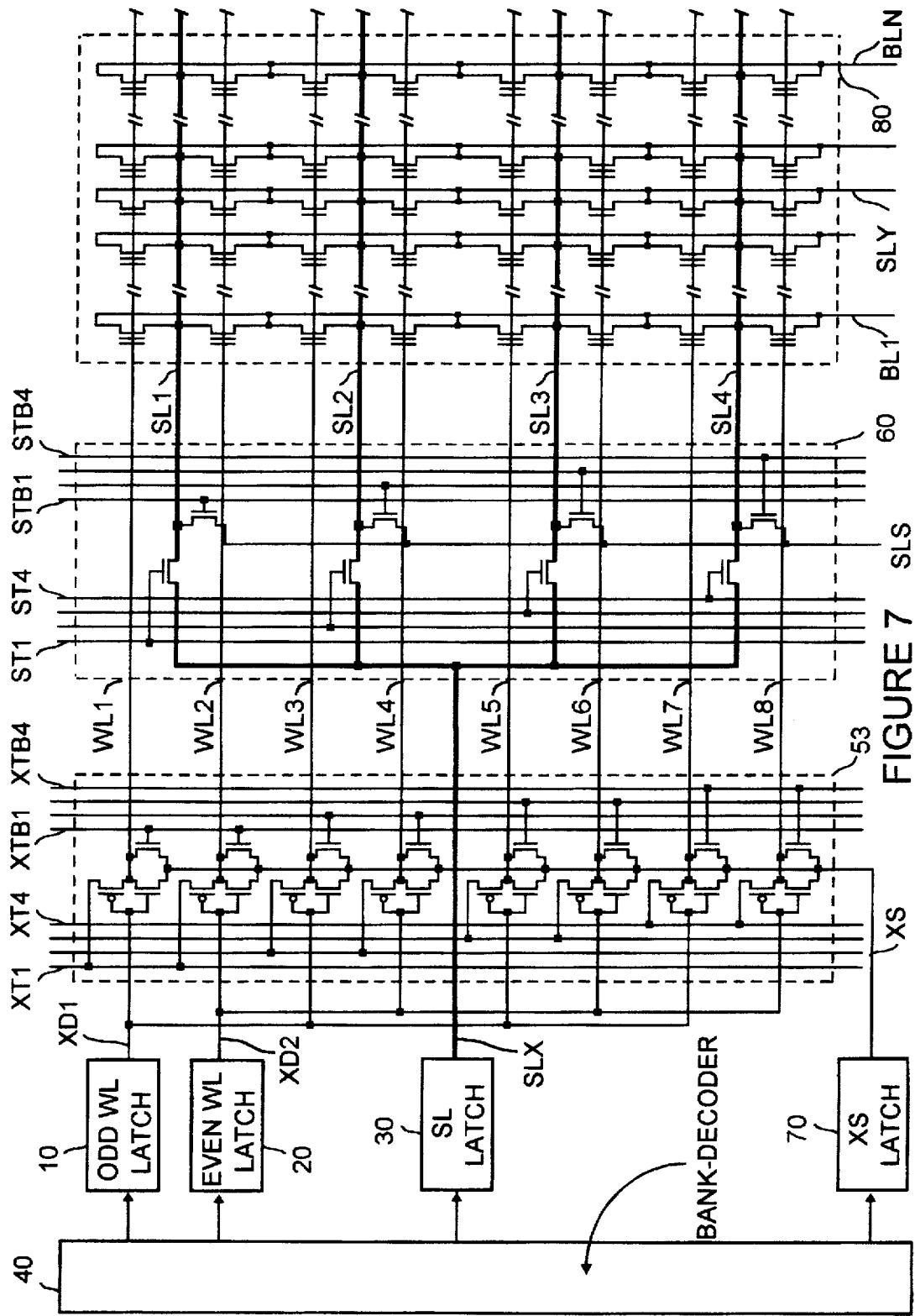
FIG. 7 shows a fourth embodiment for the circuit of a memory bank of this invention.

FIG. 7 shows a fourth embodiment of this invention. In this embodiment, the flash memory circuit comprises a WL decoder 53, an SL decoder 60 and a memory bank 80 having an array of memory cells. Each memory bank has an odd WL latch 10, an even WL latch 20, an SL latch 30, and an XS latch 70 associated with the bank. A bank decoder 40 selects different memory banks of the flash memory. This embodiment is also very similar to the second embodiment except that even and odd WL latches are used to control even and odd WLs separately in the memory bank. As shown in FIG. 7, only half of the address lines are required in the WL decoder 53 of this embodiment. In other words, each pair of WLs controlled by odd and even WL latches share an address line of XT1~XT4. Compared to the second embodiment, the additional WL latch 20 saves half of the address lines for this embodiment but provides equivalent decoding function.

Figure 8:
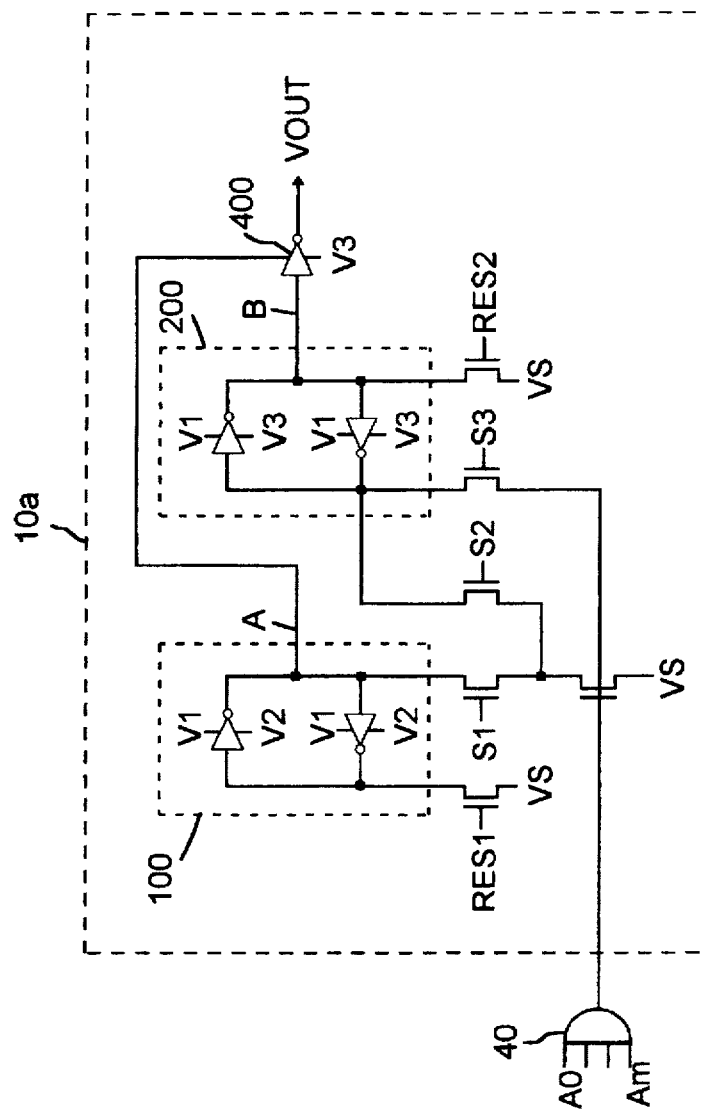
FIG. 8 shows a latch circuit for providing three voltage levels.
Figure 9:
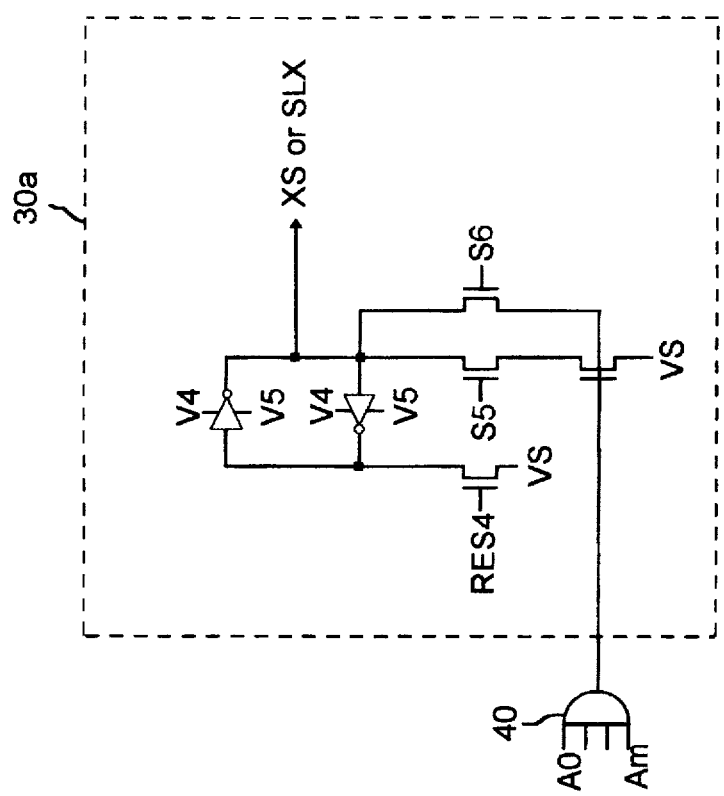
FIG. 9 shows a latch circuit for providing two voltage levels.

It should be noted that all the embodiments of this invention require that three different voltages be available to control signals such as XD in the first embodiment or XT in second, third and fourth embodiments for operation. An earlier U.S. patent application Ser. No. 08/676,066 assigned to the same assignee of this invention discloses a latch circuit that can provide three different voltages. Another U.S. patent application Ser. No. 08/823,571 assigned to the same assignee of this invention discloses methods of memory operations by applying different voltages for avoiding over-erasure problems. The WL latches of this invention uses the latch circuit and the methods described in the referenced applications. An example of such a latch circuit is shown in FIG. 8. The circuit comprises first 100 and second 200 latches, and an output driver 400. If the first latch 200 stores a high voltage level for point B, the output driver 400 provides V3 to VOUT. Otherwise, the output driver provides V1 or V2 according to the high or low voltage level stored in the latch 100 for point A. RES1, RES2, S1, S2 and S3 are control signals for setting and resetting the latch circuit as well as controlling it for proper operations under different modes. Some of signal lines of this invention such as XS, SLX and XD in the second embodiment and XT in the first embodiment require latches that can provide two voltages. An example of a two voltage latch as shown in FIG. 9 can be used. The operation of the latch is similar to that of FIG. 8 except that only two voltage levels are available.

According to this invention, a source line is shared by every two adjacent WLs as shown in the embodiments of FIGS. 1, 4, 6, and 7. In the memory array, each WL also has an n-transistor of which the gate is coupled to the WL, the source is connected to the shared source line and the drain is connected to a common SLY line as shown in FIGS. 1, 4, 6 and 7. The n-transistor is denoted as M100 in FIG. 1. The common SLY line and the transistor M100 for the source lines serve to drain large cell current of multiple bits in parallel when it is required during program operation of the flash memory array. Therefore, for the layout of the circuit, a narrow metal line of one word line width can be used for each source line. A prior art paper titled "A new Decoding Scheme and Erase Sequence for 5V Only Sector Erasable Flash Memory", published in 1992 Symposium on VLSI Circuits Digest of Technical Papers by Mitsubishi shows a flash memory using a wide metal line of four word line width for two source lines due to a large cell current required during program. The common SLY line and the transistor M100 in this invention make it possible to use a narrow metal line for a shared source line.

Figure 10A:
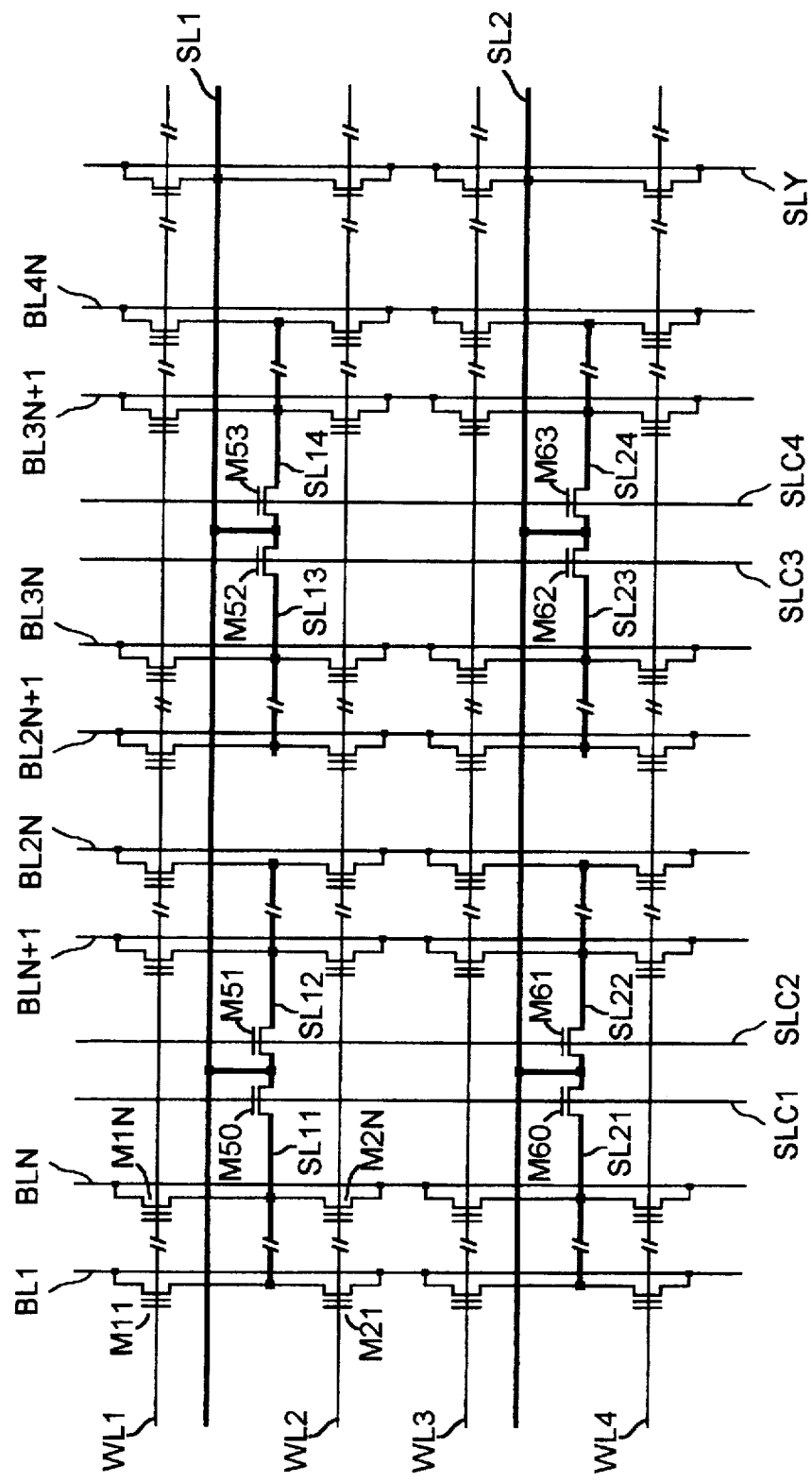
FIG. 10a shows a memory array circuit having segmented source lines of this invention.
Figure 10B:
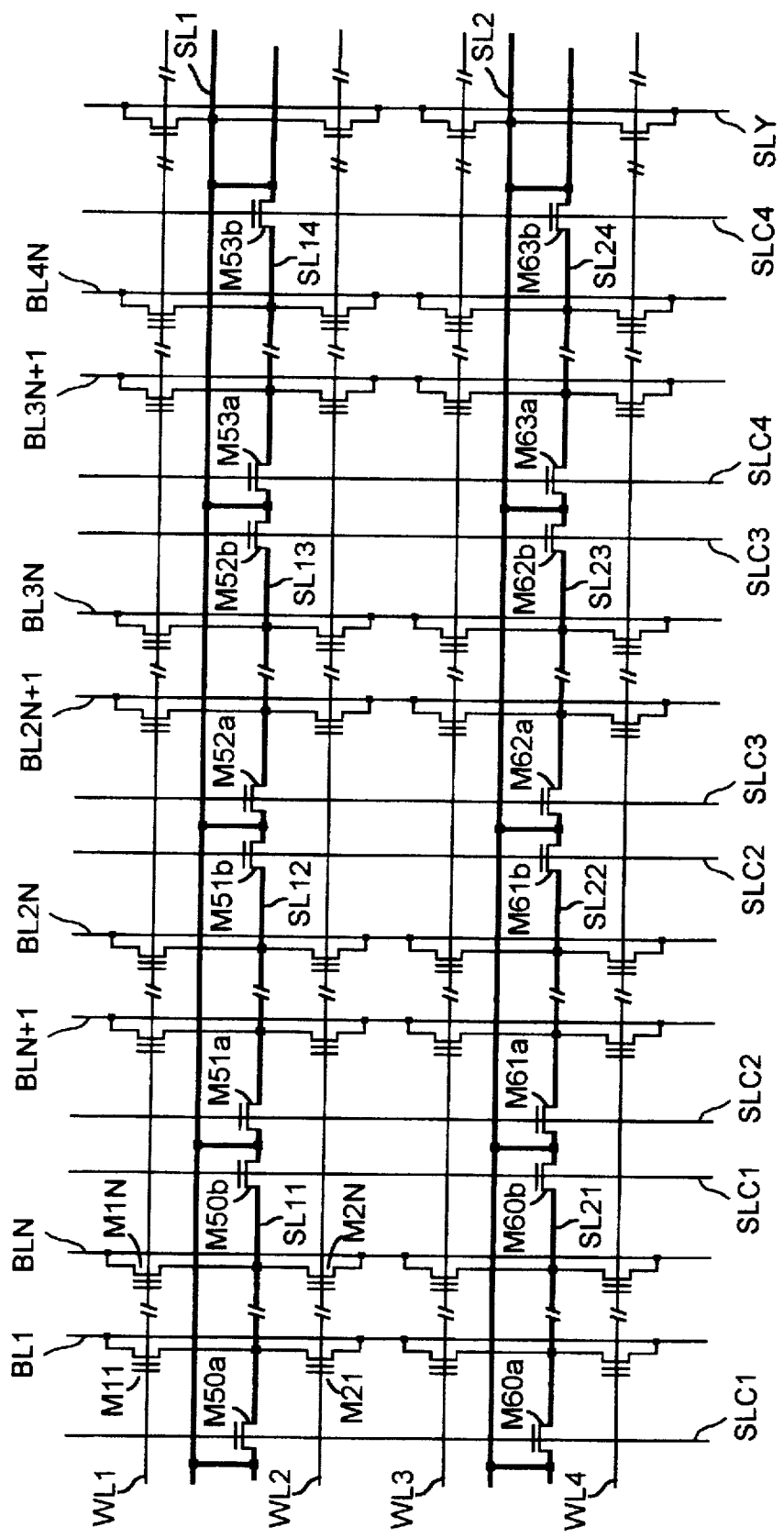
FIG. 10b shows an alternative memory array circuit having segmented source lines of this invention.

The four embodiments described so far provide the erasure of a flexible number of WLs from two to a large number of WLs. The invention further provides an innovative way of dividing a WL pair into a plurality of segments so that the memory cells in each segment of the WL pair can be selectively erased. As shown in FIG. 10a, it is assumed that the memory cells in the memory array have a number of bit lines BL1, BL2, . . . , BLN, BL(N+1), . . . , BL(2N), . . . , and so on. The word line pair WL1 and WL2 are divided into a plurality of segments each having N bit lines. Take the first segment having bit lines BL1, BL2, . . . , BLN as an example. The sources of these memory cells are wired together to form a segmented source line SL11 and then connected to the source line SL1 through an n-MOS transistor M50. Similarly, the sources of the memory cells on the first segment of WL3 and WL4 pair are wired together to form a segmented source line SL12 and then connected to the source line SL2 through another n-MOS transistor M60. The gates of the n-MOS transistors M50 and M60 are connected to a source segment control line SLC1. The control line SLC1 determines if M50 or M60 should be turned on to connect the corresponding segmented source line SL11 or SL12 to SL1 or SL2 respectively. By controlling the voltage on SLC1, this invention further provides the capability of erasing only a segment of memory cells on each WL. In other words, sub-WL erasing capability is accomplished by the circuit structure as shown in FIG. 10a. FIG. 10b shows an alternative circuit structure for providing segmented source lines. In FIG. 10b, each segmented source line such as SL11 has two source segment control lines running on both sides of the segment (but connected to the same control line voltage SLC1) and two transistors M50a and M50b to control the connection of SL11 to SL1. To achieve multiple and flexible segment erasing, a method of using an SLCN latch for each SLCN signal can be applied. The detail of this method of operation has been disclosed in a U.S. patent application Ser. No. 08/624,322 assigned to the same assignee of this invention.

Figure 11:
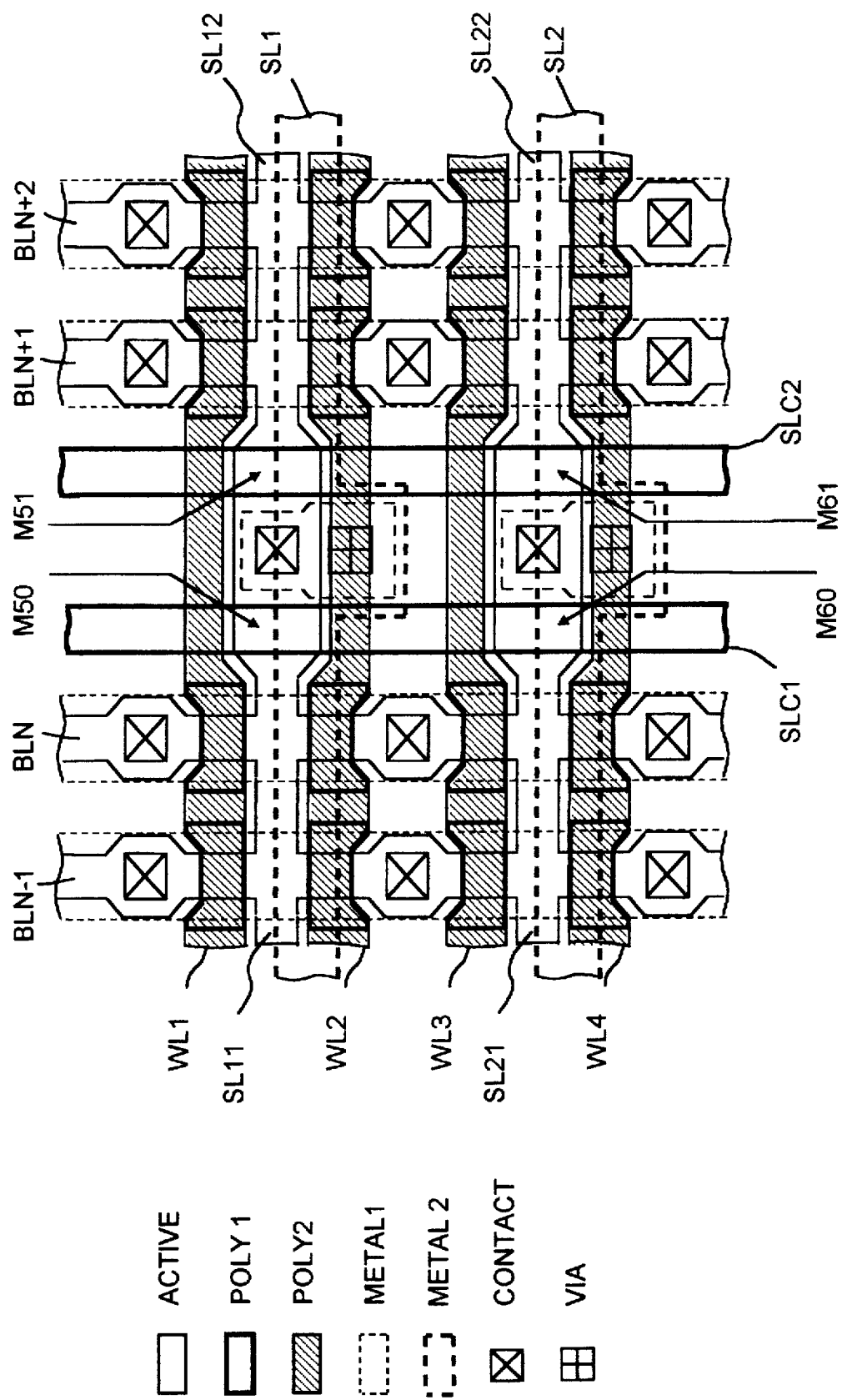

A prior art U.S. Pat. No. 4,949,309 discloses a similar but different source line circuit that also has two transistors controlling the circuit. In the layout shown in U.S. Pat. No. 4,949,309, a first metal layer is used for both bit lines and source lines that run vertically, and the controlling transistors are constructed with a second polysilicon (Poly2) layer. An exemplary layout of the circuit structure of FIG. 10a is shown in FIG. 11. The layout shows two segments of four WLs. SLC1 and SLC2 are the source segment control lines of the first and second segments respectively. In the layout of a flash memory circuit, a first polysilicon (Poly1) layer is used to form the floating gates of the memory cells and the second polysilicon (Poly2) layer is used for the word lines. Due to the high density, there is no space available for building other transistors with the Poly2 layer. This invention presents the layout as shown in FIG. 11 in which the source segment control lines SLC1 and SLC2 as well as the transistors M50 and M60 are constructed with the Poly1 layer. Because in the flash memory technology the Poly1 layer is used to form the isolated floating gate of all memory cells, the Poly1 layer without the mask of Poly2 layer is etched away. This is done by using a self-aligned etching (SAE) technique with a special SAE mask. In this invention, however, the transistors M50 and M60 as well as control lines SLC1 and SLC2 have to be protected from being etched away. Therefore, the traditional SAE layer can be modified to exclude these Poly1 devices and its Poly1 gate lines from the regular Poly1 lines which are overlapping with the first metal lines of bit lines. No extra mask is required.

Figure 12C:
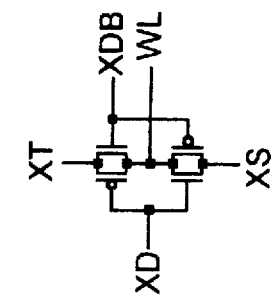
FIG. 12c shows another exemplary gating device which can be used to replace the gating device of FIG. 5.
Figure 12B:
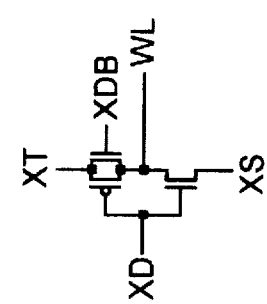
FIG. 12b shows an exemplary gating device which can be used to replace the gating device of FIG. 5.
Figure 12A:
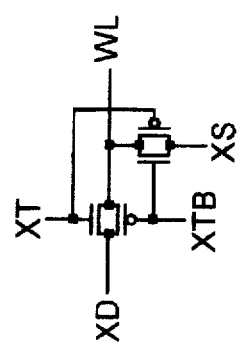
FIG. 12a shows an exemplary gating device which can be used to replace the gating device of FIG. 2.

In the above description, two types of gating devices for controlling the connection of word lines to word line latches, XS latches or XT address lines in a word line decoder have been shown. Transistors M1a, M1b and M1c of FIG. 2 form a gating device that is used for the first embodiment and transistors M1a, M1b and M1c of FIG. 5 form another gating device that can be used for the second embodiment. It should be noted the gating device can be modified in many ways by designing the circuit properly. For example, the circuit of FIG. 12a can be used to replace M1a, M1b and M1c of FIG. 2. Similarly, the circuit of FIG. 12b or FIG. 12c has identical function as the circuit formed by M1a, M1b and M1c of FIG. 5. The exemplary circuits shown and illustrated above are presented only for the convenience of explaining the principle of this invention. A person skilled in the field should be able to make modification that comes within the spirit of this invention based on the above described principle.

Although in the above disclosure fixed voltages such as XD=−8V, SLX=+5V for erasing selected word lines and other bias conditions have been described to illustrate and explain the operations of different embodiments, these bias conditions should not be deemed to limit the scope of the invention. As an example, it may be preferred to have XD=0V, SLX=+12V and ST1~ST4=13V for the embodiment of FIG. 1 in some circuit systems for erasing memory cells. In addition, the negative cut-off voltage mentioned many times above is a variable voltage determined while the verify operation is performed. This voltage is then used to determine the optimal programming and erasing voltages. With the disclosed embodiments, a person skilled in the field should be able to choose various bias conditions to achieve optimal memory operations based on different system requirements for a practical application.

As pointed out in this disclosure, the flash memory circuits of this invention allow the erasure of the memory cells on a single word line. It is also possible to erase the memory cells of a single bytes or a small segment of a single word line. Nevertheless, the memory cells of adjacent non-selected word lines or word line segments may be disturbed. A method of overcoming the drawback of erasing a single selected word line is to remember and store the programmed data of the memory cells on the non-selected adjacent WL before the erase operation. After the selected WL has been successfully verified, the stored data of its adjacent WL before erasing are retrieved and compared with the read data of the memory cells on the disturbed WL after erasing. A program operation is performed to restore the data if these data do not match within a safe read margin. Although this approach can also be applied to a conventional flash memory circuit, the present invention provides the advantage that only memory cells on a disturbed word line has to restored. This is because in this invention the memory cells on the adjacent word line can be turned off to minimize data disturbance when a single word line is erased. Therefore, only disturbed memory cells have to be reprogrammed. Conventional flash memory circuits, however, a whole block of memory cells have to be erased and reprogrammed.

Figure 13:
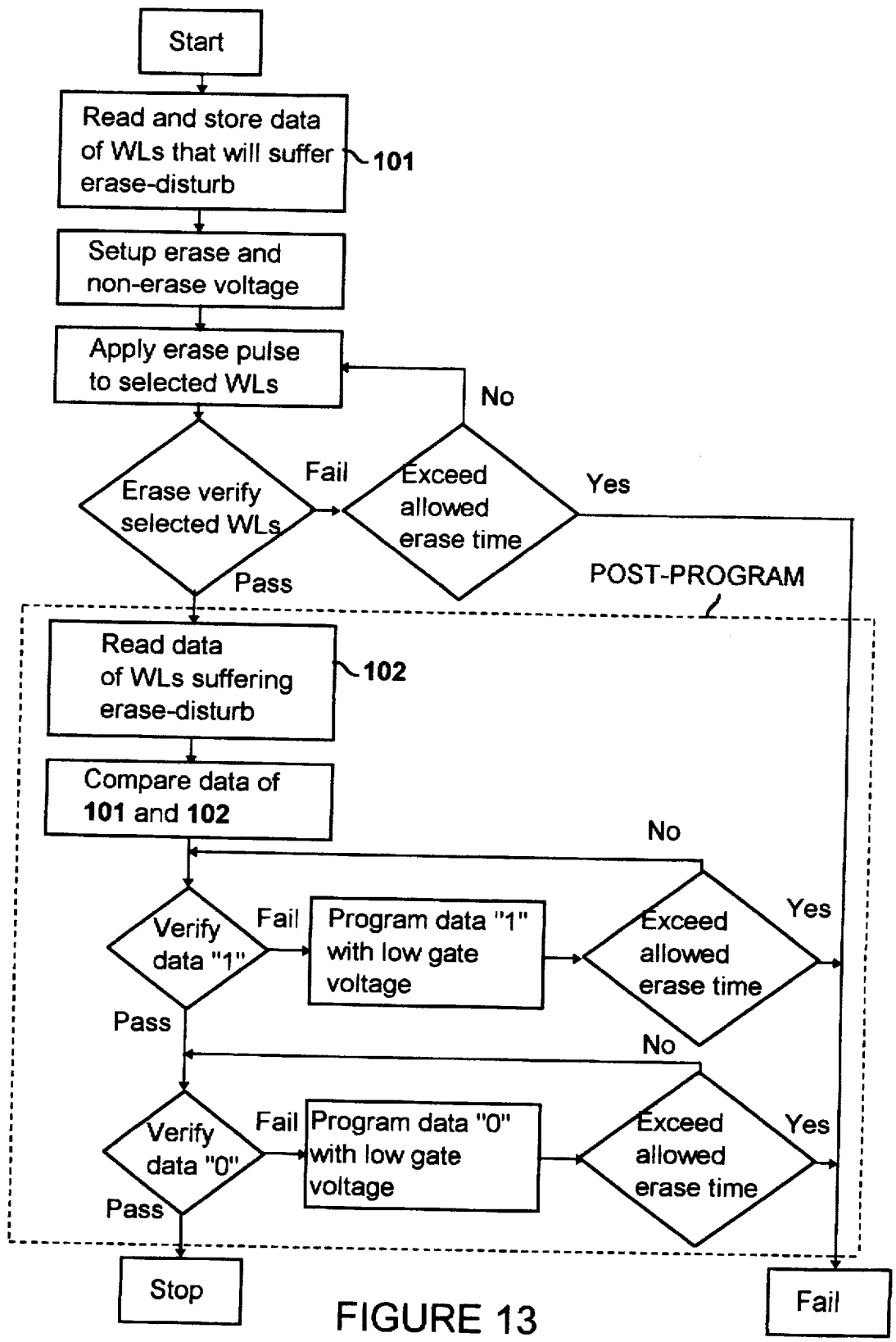
FIG. 13 shows a flow chart of the method of this invention for erasing a single word and post-programming the word lines that have been disturbed.

FIG. 13 shows a flow chart of the method of erasing a single word line in this invention. It can be summarized as follows:

a. Read all the memory data from the adjacent word line that shares the same source line with the word line which has been selected for erasing and store the data in either on-chip or off-chip static random access memories (SRAM);

b. Apply appropriate erase voltages to the selected word line and shut off the other non-selected word lines;

c. Apply erase pulse to the selected single word line;

d. Verify the memory cells on the selected word line. If the selected word line passes the verification, the erase operation is terminated. If it fails the verification and the allowable erase time limit has not been reached, the erase cycle is repeated by applying another erase pulse until the verification has been passed. If the allowable erase time limit has been exceeded, the flash memory device is considered defective.

e. After the erase and verification have been completed, the memory data of the adjacent word line are read and compared with the stored memory data.

f. Verify data "0" which has a threshold voltage around 4V in a 3V operation. If it fails, the memory cell is post-programmed to restore its threshold voltage back to more than 4V. If the allowable erase time is exceeded before being successfully re-programmed, the flash memory device is considered defective.

g. Verify data "1" which has a threshold voltage around 1V in a 3V operation. If it fails, the memory cell is post-programmed to restore its threshold voltage back to 1V. If the allowable erase time is exceeded before being successfully programmed, the flash memory device is considered defective.

h. If both data "0" and "1" are successfully restored to the memory cells of the adjacent word line, the erase operation of a single word line is completed and terminated.

For erasing memory cells of a small segment of a single word line, the operation is similar except that the non-selected memory cells that suffer the wordline disturbance on the selected word line also have to be read and stored in SRAM in addition to the memory cells of the adjacent non-selected word line that suffer the source disturbance. Those memory cells have to be verified and restored if they have been disturbed during the erase operation.

What is claimed is:

1. A flash memory array comprising:

a plurality of flash memory cells being arranged in a plurality of rows and a plurality of columns, each of said flash memory cells having a control gate, a drain a source;

a plurality of odd word lines each connecting the control gates of all the flash memory cells in a same odd row;

a plurality of even word lines each connecting the control gates of all the flash memory cells in a same even row;

a plurality of bit lines each connecting the drains of all the flash memory cells in a same column;

and a plurality of source lines each connecting the sources of all the flash memory cells in an odd row and an associated even row next to the odd row.

2. The flash memory array according to claim 1, further comprising at least a column of transistors each having a gate coupled to a word line of a row of memory cells for connecting the source line associated with the row to a source current draining line for shunting high cell current in a program operation, said associated source line being connected to a first ground and said source current draining line being connected to a second ground in a program operation.

3. The flash memory array according to claim 1, wherein each of said plurality of source lines is disconnected from the sources of the memory cells of an odd row and an associated even rows, said memory array is divided into a plurality of segments each comprising a number of columns, and each segment has a plurality of segmented source lines each being formed by wiring the sources of all the memory cells in an odd row and an associated even row next to the odd row within the segment together and then connected to the source line associated with the odd and even rows through at least one source segment control transistor having a gate coupled to a source segment control line of the segment.

4. The flash memory array according to claim 3, wherein said segmented source control line and said source segment control transistor are constructed with a first polysilicon layer, and said plurality of odd and even word lines and the control gates of said plurality of flash memory cells are formed by a second polysilicon layer.

5. A flash memory circuit having a plurality of flash memory banks each comprising:

a flash memory array including:

a plurality of flash memory cells being arranged in a plurality of rows and a plurality of columns, each of said flash memory cells having a control gate, a drain and a source;

a plurality of odd word lines each connecting the control gates of all the flash memory cells in a same odd row;

a plurality of even word lines each connecting the control gates of all the flash memory cells in a same even row;

a plurality of bit lines each connecting the drains of all the flash memory cells in a same column;

and a plurality of source lines each connecting the sources of all the flash memory cells in an odd row and an associated even row next to the odd row;

a bank decoder;

a source line voltage controlled by said bank decoder;

a source line decoder having:
 a source control line;
 a plurality of source primary address lines and source secondary address lines, each source primary address line having a corresponding source secondary address line; and
 a plurality of source gating devices each being coupled to a source primary address line and a corresponding source secondary address line for connecting a source line to either said source line voltage or said source control line;

an odd word line voltage controlled by said bank decoder;

an even word line voltage controlled by said bank decoder;

and a word line decoder having:
 a word control line;
 a plurality of word primary address lines and word secondary address lines, each word primary address line having a corresponding word secondary address line;
 and a plurality of word gating devices each being coupled to a word primary address line and a corresponding word secondary address line for connecting an odd word line to either said odd word line voltage or said word control line, or for connecting an even word line to either said even word line voltage or said word control line;
 wherein an odd word gating device and an adjacent even word gating device being coupled to a same word primary address line and a same secondary address line for connecting an odd word line and an even word line respectively at the same time.

6. The flash memory circuit according to claim 5, further comprising:

a source line latch controlled by said bank decoder for providing said source line voltage;

an odd word line latch controlled by said bank decoder for providing said odd word line voltage;

and an even word line latch controlled by said bank decoder for providing said even word line voltage.

7. The flash memory circuit according to claim 6, each of said source gating devices further comprising first and second transistors having gates coupled to a source primary address line and a corresponding source secondary address line respectively for connecting a source line to either said source line latch or said source control line.

8. The flash memory circuit according to claim 6, each of said word gating devices further comprising:

a pair of n-channel and p-channel transistors having gates coupled to a word primary address line and a corresponding word secondary address line respectively for connecting an odd word line to said odd word line latch, or for connecting an even word line to said even word line latch;

and an n-channel transistor having a gate coupled to a word secondary address line for connecting an odd or even word line to said word control line;

wherein the word secondary address line coupled to said n-channel transistor is the same word secondary address line coupled to said pair of transistors and the word line connected by said n-channel transistor is the same word line connected by said pair of transistors.

9. The flash memory circuit according to claim 6, further comprising at least a column of transistors each having a gate coupled to a word line of a row of memory cells for connecting the source line associated with the row to a source current draining line for shunting high cell current in a program operation, said associated source line being connected to a first ground and said source current draining line being connected to a second ground in a program operation.

10. The flash memory circuit according to claim 6, each of said source gating devices further comprising:

first and second transistors having gates coupled to a source primary address line and a corresponding source secondary address line respectively for connecting a source line to either said source line latch or said source control line;

each of said word gating devices further comprising:
 a pair of n-channel and p-channel transistors having gates coupled to a word primary address line and a corresponding word secondary address line respectively for connecting an odd word line to said odd word line latch, or for connecting an even word line to said even word line latch;
 and an n-channel transistor having a gate coupled to a word secondary address line for connecting an odd or even word line to said word control line;
 wherein the word secondary address line coupled to said n-channel transistor is the same word secondary address line coupled to said pair of transistors and the word line connected by said n-channel transistor is the same word line connected by said pair of transistors;

and said memory array further comprising:
 at least a column of transistors each having a gate coupled to a word line of a row of memory cells for connecting the source line associated with the row to a source current draining line for shunting high cell current in a program operation, said associated source line being connected to a first ground and said source current draining line being connected to a second ground in a program operation.

11. The flash memory circuit according to claim 6, wherein each of said plurality of source lines is disconnected from the sources of the memory cells of an odd row and an associated even rows, said memory array is divided into a plurality of segments each comprising a number of columns, and each segment has a plurality of segmented source lines each being formed by wiring the sources of all the memory cells in an odd row and an associated even row next to the odd row within the segment together and then connected to the source line associated with the odd and even rows through at least one source segment control transistor having a gate coupled to a source segment control line of the segment.

12. The flash memory circuit according to claim 6, wherein said segmented source control line and said source segment control transistor are constructed with a first polysilicon layer, and said plurality of odd and even word lines and the control gates of said plurality of flash memory cells are formed by a second polysilicon layer.

13. A flash memory circuit having a plurality of flash memory banks each comprising:
   a flash memory array including:
      a plurality of flash memory cells being arranged in a plurality of rows and a plurality of columns, each of said flash memory cells having a control gate, a drain and a source;
      a plurality of word lines each connecting the control gates of all the flash memory cells in a same row;
      a plurality of bit lines each connecting the drains of all the flash memory cells in a same column;
      and a plurality of source lines each connecting the sources of all the flash memory cells in an odd row and an associated even row next to the odd row;
   a bank decoder;
   a source line voltage controlled by said bank decoder;
   a source line decoder having:
      a source control line;
      a plurality of source primary address lines and source secondary address lines, each source primary address line having a corresponding source secondary address line; and
      a plurality of source gating devices each being coupled to a source primary address line and a corresponding source secondary address line for connecting a source line to either said source line voltage or said source control line;
   a word control line controlled by said bank decoder;
   a word line voltage controlled by said bank decoder;
   and a word line decoder having:
      a plurality of word primary address lines and word secondary address lines, each word primary address line having a corresponding word secondary address line;
      and a plurality of word gating devices each being coupled to a word secondary address line and controlled by said word line voltage for connecting a word line to either a corresponding word primary address line or said word control line.

14. The flash memory circuit according to claim 13 further comprising:
   a source line latch controlled by said bank decoder for providing said source line voltage;
   a word control latch controlled by said bank decoder for providing said word control line;
   and a word line latch controlled by said bank decoder for providing said word line voltage.

15. The flash memory circuit according to claim 14, each of said source gating devices further comprising first and second transistors having gates coupled to a source primary address line and a corresponding source secondary address line respectively for connecting a source line to either said source line latch or said source control line.

16. The flash memory circuit according to claim 14, each of said word gating devices further comprising:
   a pair of p-channel and n-channel transistors having gates connected together and coupled to said word line latch for connecting a word line to a word primary address line or said word control latch;
   and an n-channel transistor having a gate coupled to a word secondary address line for connecting the word line being connected to said pair of transistors to said word control latch;
   wherein the word secondary address line coupled to said n-channel transistor is the corresponding word secondary address line of the word primary address line coupled to said pair of transistors.

17. The flash memory circuit according to claim 14, said memory array further comprising at least a column of transistors each having a gate coupled to a word line of a row of memory cells for connecting the source line associated with the row to a source current draining line for shunting high cell current in a program operation, said associated source line being connected to a first ground and said source current draining line being connected to a second ground in a program operation.

18. The flash memory circuit according to claim 14, each of said source gating devices further comprising:
   first and second transistors having gates coupled to a source primary address line and a corresponding source secondary address line respectively for connecting a source line to either said source line latch or said source control line;
   each of said word gating devices further comprising:
      a pair of p-channel and n-channel transistors having gates connected together and coupled to said word line latch for connecting a word line to a word primary address line or said word control latch;
      and an n-channel transistor having a gate coupled to a word secondary address line for connecting the word line being connected to said pair of transistors to said word control latch;
      wherein the word secondary address line coupled to said n-channel transistor is the same word secondary address line coupled to said pair of transistors;
   and said memory array further comprising:
      at least a column of transistors each having a gate coupled to a word line of a row of memory cells for connecting the source line associated with the row to a source current draining line for shunting high cell current in a program operation, said associated source line being connected to a first ground and said source current draining line being connected to a second ground in a program operation.

19. The flash memory circuit according to claim 14, wherein each of said plurality of source lines is disconnected from the sources of the memory cells of an odd row and an associated even rows, said memory array is divided into a plurality of segments each comprising a number of columns, and each segment has a plurality of segmented source lines each being formed by wiring the sources of all the memory cells in an odd row and an associated even row next to the odd row within the segment together and then connected to the source line associated with the odd and even rows through at least one source segment control transistor having a gate coupled to a source segment control line of the segment.

20. The flash memory circuit according to claim 14, wherein said segmented source control line and said source segment control transistor are constructed with a first polysilicon layer, and said plurality of word lines and the control gates of said plurality of flash memory cells are formed by a second polysilicon layer.

21. A flash memory circuit having a plurality of flash memory banks each comprising:
   a flash memory array including:
      a plurality of flash memory cells being arranged in a plurality of rows and a plurality of columns, each of said flash memory cells having a control gate, a drain and a source;

a plurality of word lines each connecting the control gates of all the flash memory cells in a same row;

a plurality of bit lines each connecting the drains of all the flash memory cells in a same column;

and a plurality of source lines each connecting the sources of all the flash memory cells in an odd row and an associated even row next to the odd row;

a bank decoder;

a source line voltage controlled by said bank decoder;

a source line decoder having:

a source control line;

a plurality of source primary address lines and source secondary address lines, each source primary address line having a corresponding source secondary address line; and a plurality of source gating devices each being coupled to a source primary address line and a corresponding source secondary address line for connecting a source line to either said source line voltage or said source control line;

a word control line controlled by said bank decoder;

a first word line voltage controlled by said bank decoder;

a second word line voltage controlled by said bank decoder; and a word line decoder having:

a plurality of word primary address lines and word secondary address lines, each word primary address line having a corresponding word secondary address line;

and a plurality of word gating devices each being coupled to a word secondary address line and controlled by said first and second word line voltages for connecting a word line to either a corresponding word primary address line or said word control line.

22. The flash memory circuit according to claim 21 further comprising:

a source line latch controlled by said bank decoder for providing said source line voltage;

a word control latch controlled by said bank decoder for providing said word control line;

a first word line latch controlled by said bank decoder for providing said first word line voltage;

and a second word line latch controlled by said bank decoder for providing said second word line voltage.

23. The flash memory circuit according to claim 22, each of said source gating devices further comprising first and second transistors having gates coupled to a source primary address line and a corresponding source secondary address line respectively for connecting a source line to either said source line latch or said source control line.

24. The flash memory circuit according to claim 22, each of said word gating devices further comprising:

a pair of p-channel and n-channel transistors having gates coupled to said first and second word line latches respectively for connecting a word line to a word primary address line or to said word control latch;

and an n-channel transistor having a gate coupled to a word secondary address line for connecting the word line being connected to said pair of transistors to said word control latch;

wherein the word secondary address line coupled to said n-channel transistor is the corresponding word secondary address line of the word primary address line coupled to said pair of transistors.

25. The flash memory circuit according to claim 22, said memory array further comprising at least a column of transistors each having a gate coupled to a word line of a row of memory cells for connecting the source line associated with the row to a source current draining line for shunting high cell current in a program operation, said associated source line being connected to a first ground and said source current draining line being connected to a second ground in a program operation.

26. The flash memory circuit according to claim 22, each of said source gating devices further comprising:

first and second transistors having gates coupled to a source primary address line and a corresponding source secondary address line respectively for connecting a source line to either said source line latch or said source control line;

each of said word gating devices further comprising:

a plurality of word primary address lines and word secondary address lines, each word primary address line having a corresponding word secondary address line; and a plurality of word gating devices each being coupled to a word secondary address line and controlled by said first and second word line voltages for connecting a word line to either a corresponding word primary address line or said word control line;

and said memory array further comprising:

at least a column of transistors each having a gate coupled to a word line of a row of memory cells for connecting the source line associated with the row to a source current draining line for shunting high cell current in a program operation, said associated source line being connected to a first ground and said source current draining line being connected to a second ground in a program operation.

27. The flash memory circuit according to claim 22, wherein each of said plurality of source lines is disconnected from the sources of the memory cells of an odd row and an associated even rows, said memory array is divided into a plurality of segments each comprising a number of columns, and each segment has a plurality of segmented source lines each being formed by wiring the sources of all the memory cells in an odd row and an associated even row next to the odd row within the segment together and then connected to the source line associated with the odd and even rows through at least one source segment control transistor having a gate coupled to a source segment control line of the segment.

28. The flash memory circuit according to claim 22, wherein said segmented source control line and said source segment control transistor are constructed with a first polysilicon layer, and said plurality of word lines and the control gates of said plurality of flash memory cells are formed by a second polysilicon layer.

29. A flash memory circuit having a plurality of flash memory banks each comprising:

a flash memory array including:

a plurality of flash memory cells being arranged in a plurality of rows and a plurality of columns, each of said flash memory cells having a control gate, a drain and a source;

a plurality of odd word lines each connecting the control gates of all the flash memory cells in a same odd row;

a plurality of even word lines each connecting the control gates of all the flash memory cells in a same even row;

a plurality of bit lines each connecting the drains of all the flash memory cells in a same column;

and a plurality of source lines each connecting the sources of all the flash memory cells in an odd row and an associated even row next to the odd row;

a bank decoder;

a source line voltage controlled by said bank decoder;

a source line decoder having:

a source control line;

a plurality of source primary address lines and source secondary address lines, each source primary address line having a corresponding source secondary address line; and a plurality of source gating devices each being coupled to a source primary address line and a corresponding source secondary address line for connecting a source line to either said source line voltage or said source control line;

a word control line controlled by said bank decoder;

an odd word line voltage controlled by said bank decoder;

an even word line voltage controlled by said bank decoder;

and a word line decoder having:

a plurality of word primary address lines and word secondary address lines, each word primary address line having a corresponding word secondary address line;

and a plurality of word gating devices each being coupled to a word secondary address line and controlled by said odd word line voltage for connecting an odd word line to either a corresponding word primary address line or said word control line, or being coupled to a word secondary address line and controlled by said even word line voltage for connecting an even word line to either a corresponding word primary address line or said word control line;

wherein an odd word gating device and an adjacent even word gating device being coupled to a same word primary address line and a same secondary address line for connecting an odd word line and an even word line respectively at the same time.

30. The flash memory circuit according to claim 29, further comprising:

a source line latch controlled by said bank decoder for providing said source line voltage;

a word control latch controlled by said bank decoder for providing said word control line;

an odd word line latch controlled by said bank decoder for providing said odd word line voltage;

and an even word line latch controlled by said bank decoder for providing said even word line voltage.

31. The flash memory circuit according to claim 29, each of said source gating devices further comprising first and second transistors having gates coupled to a source primary address line and a corresponding source secondary address line respectively for connecting a source line to either said source line latch or said source control line.

32. The flash memory circuit according to claim 29, each of said word gating devices further comprising:

a pair of p-channel and n-channel transistors having gates connected together and coupled to said odd word line latch for connecting an odd word line to a word primary address line or to said word control latch, or having gates connected together and coupled to said even word line latch for connecting an even word line to a word primary address line or to said word control latch;

and an n-channel transistor having a gate coupled to a word secondary address line for connecting the word line being connected to said pair of transistors to said word control latch;

wherein the word secondary address line coupled to said n-channel transistor is the corresponding word secondary address line of the word primary address line coupled to said pair of transistors.

33. The flash memory circuit according to claim 29, said memory array further comprising at least a column of transistors each having a gate coupled to a word line of a row of memory cells for connecting the source line associated with the row to a source current draining line for shunting high cell current in a program operation, said associated source line being connected to a first ground and said source current draining line being connected to a second ground in a program operation.

34. The flash memory circuit according to claim 29, each of said source gating devices further comprising:

first and second transistors having gates coupled to a source primary address line and a corresponding source secondary address line respectively for connecting a source line to either said source line latch or said source control line;

each of said word gating devices further comprising:

a pair of p-channel and n-channel transistors having gates connected together and coupled to said odd word line latch for connecting an odd word line to a word primary address line or to said word control latch, or having gates connected together and coupled to said even word line latch for connecting an even word line to a word primary address line or to said word control latch;

and an n-channel transistor having a gate coupled to a word secondary address line for connecting the word line being connected to said pair of transistors to said word control latch;

wherein the word secondary address line coupled to said n-channel transistor is the corresponding word secondary address line of the word primary address line coupled to said pair of transistors;

and said memory array further comprising:

at least a column of transistors each having a gate coupled to a word line of a row of memory cells for connecting the source line associated with the row to a source current draining line for shunting high cell current in a program operation, said associated source line being connected to a first ground and said source current draining line being connected to a second ground in a program operation.

35. The flash memory circuit according to claim 29, wherein each of said plurality of source lines is disconnected from the sources of the memory cells of an odd row and an associated even rows, said memory array is divided into a plurality of segments each comprising a number of columns, and each segment has a plurality of segmented source lines each being formed by wiring the sources of all the memory cells in an odd row and an associated even row next to the odd row within the segment together and then connected to the source line associated with the odd and even rows through at least one source segment control transistor having a gate coupled to a source segment control line of the segment.

36. The flash memory circuit according to claim 29, wherein said segmented source control line and said source segment control transistor are constructed with a first polysilicon layer, and said plurality of odd and even word lines and the control gates of said plurality of flash memory cells are formed by a second polysilicon layer.

37. A method of simultaneously erasing the memory cells of two adjacent rows each having a word line and both sharing a source line in a selected memory bank of a flash memory circuit having a plurality of memory banks each including a bank decoder, a word line decoder and a source line decoder, comprising the steps of:

sending appropriate address signals to the word line decoder of the selected memory bank for selecting two adjacent word lines;

sending appropriate address signals to the source line decoder of the selected memory bank for selecting the source line shared by the selected adjacent word lines;

applying a first voltage to the selected adjacent word lines from said bank decoder of the selected memory bank;

applying a second voltage to the selected source line from said bank decoder of the selected memory bank;

and applying a third voltage to the word lines of other non-selected memory banks;

wherein said first and second voltages providing sufficient voltage difference for erasing the memory cells connected to the selected word lines.

38. The method of simultaneously erasing the memory cells of two adjacent rows according to claim 37, further including a method of erase-verifying the memory cells of the two erased rows one row at a time, said erase-verifying method comprising the steps of:

sending appropriate address signals to the word line decoder of the selected memory bank for selecting two erased adjacent word lines;

sending appropriate address signals to the source line decoder of the selected memory bank for selecting the source line shared by the selected adjacent word lines;

applying a third voltage to one of the selected adjacent word lines under verification from said bank decoder;

and applying a fourth voltage to the other word line of the selected adjacent word lines while a fifth voltage is applied to the word lines of other non-selected memory banks;

wherein said third voltage verifies if the memory cells connected to the word line under verification are erased properly, said fourth voltage provides a sufficiently low voltage for shutting off all the memory cells connected to the other word line of the selected adjacent word lines; and said fifth voltage grounds all the word lines of other non-selected memory banks.

39. The method of simultaneously erasing the memory cells of two adjacent rows according to claim 38, wherein said bank decoder includes odd and even word line latches for providing voltages to odd and even word lines respectively, and a source line latch for providing a voltage to a source line.

40. A method of erase-verifying the memory cells of two erased adjacent rows each having a word line and both sharing a source line one row at a time in a selected memory bank of a flash memory circuit having a plurality of memory banks each including a bank decoder, a word line decoder and a source line decoder, comprising the steps of:

sending appropriate address signals to the word line decoder of the selected memory bank for selecting two erased adjacent word lines;

sending appropriate address signals to the source line decoder of the selected memory bank for selecting the source line shared by the selected adjacent word lines;

applying a first voltage to one of the selected adjacent word lines under verification from said bank decoder;

and applying a second voltage to the other word line of the selected adjacent word lines while a third voltage is applied to the word lines of other non-selected memory banks;

wherein said first voltage verifies if the memory cells connected to the word line under verification are erased properly, said second voltage provides a sufficiently low voltage for shutting off all the memory cells connected to the other word line of the selected adjacent word lines; and said third voltage grounds all the word lines of other non-selected memory banks.

41. A method of memory operation for erasing and verifying one or more flash memory cells of a selected single word line in a flash memory circuit having a plurality of rows each having a word line, comprising the steps of:

a. locating a plurality of stressed flash memory cells including non-selected memory cells of said selected word line and all the memory cells of non-selected word lines that will suffer from memory data disturbance if said selected single word line is applied an erase bias condition;

b. reading data of said stressed flash memory cells and storing the data in a random access memory;

c. setting up said erase bias condition for erasing said selected single word line and bias conditions for other non-selected word lines;

d. applying an erase pulse to said selected word line for erasing one or more flash memory cells of said selected word line;

e. performing data verification for said one or more flash memory cells of said selected word line;

f. returning to step d. if said data verification of step e. fails and a pre-determined time limit is not exceeded, otherwise, continuing step g.

g. continuing step h. if said data verification of step e. succeeds, otherwise, going to step o.;

h. reading new data and executing data "1" verification for a first group of said stressed memory cells, said first group of stressed memory cells having data value "1" stored in said random access memory;

i. continuing step k. if said data "1" verification of step h. succeeds, otherwise executing step j.;

j. post-programming data "1" to the memory cells of said first group if said data "1" verification of step h. fails and a pre-determined time limit is not exceeded, and returning to step h., otherwise, going to step o.;

k. reading new data and executing data "0" verification for a second group of said stressed memory cells, said second group of stressed memory cells having data value "0" stored in said random access memory;

l. going to step n. if said data "0" verification of step k. succeeds, otherwise executing step m.;

m. post-programming data "0" to the memory cells of said second group if said data "0" verification of step k. fails and a pre-determined time limit is not exceeded, and returning to step k., otherwise, going to step o.;

n. exiting said memory operation successfully;

o. declaring said flash memory circuit defective and exiting said memory operation.

* * * * *

UNITED STATES PATENT AND TRADEMARK OFFICE
CERTIFICATE OF CORRECTION

PATENT NO. : 5,777,924
DATED : July 7, 1998
INVENTOR(S) : Peter Wung Lee et al

It is certified that error appears in the above-identified patent and that said Letters Patent is hereby corrected as shown below:

Column 3, line 24, change "and FIG. 3b(CONT.) summarize" to --summarizes--.

Column 3, line 33, change "and FIG. 5b(CONT.) summarize" to --summarizes--.

Column 14, line 56, change "segmented source" to --source segment--.

Column 16, line 66, change "6" to --11--.

Column 16, line 67, change "segmented source" to --source segment--.

Column 18, line 57, change "14" to --19--.

Column 18, line 58, change "segmented source" to --source segment--.

UNITED STATES PATENT AND TRADEMARK OFFICE
CERTIFICATE OF CORRECTION

PATENT NO. : 5,777,924
DATED : July 7, 1998
INVENTOR(S) : Peter Wung Lee et al

It is certified that error appears in the above-identified patent and that said Letters Patent is hereby corrected as shown below:

Column 20, line 47, change "22" to --27--.

Column 20, line 48, change "segmented source" to --source segment--

Column 21, line 51, change "29" to --30--.

Column 21, line 57, change "29" to --30--.

Column 22, line 7, change "29" to --30--.

Column 22, line 16, change "29" to --30--.

Column 22, line 49, change "29" to --30--.

Column 22, line 62, change "29" to --35--.

Column 22, line 63, change "segmented source" to --source segement--.

Signed and Sealed this

Thirtieth Day of March, 1999

Attest:

Q. TODD DICKINSON

*Attesting Officer*   Acting Commissioner of Patents and Trademarks

UNITED STATES PATENT AND TRADEMARK OFFICE
CERTIFICATE OF CORRECTION

PATENT NO. : 5,777,924

DATED : July 7, 1998

INVENTOR(S) : Peter Wung Lee, et al.

It is certified that error appears in the above-identified patent and that said Letters Patent is hereby corrected as shown below:

On the title page,

In Item [57], line 3, delete "decoders and" and insert --decoder and the--.

In Item [57], line 8, change "eliminates" to --eliminate--.

Signed and Sealed this

First Day of June, 1999

Attest:

Attesting Officer

Q. TODD DICKINSON

Acting Commissioner of Patents and Trademarks